(12) United States Patent
Shigihara et al.

(10) Patent No.: US 10,818,620 B2
(45) Date of Patent: Oct. 27, 2020

(54) SEMICONDUCTOR INTEGRATED CIRCUIT DEVICE

(71) Applicant: Renesas Electronics Corporation, Tokyo (JP)

(72) Inventors: Hiromi Shigihara, Tokyo (JP); Hiroshi Tsukamoto, Tokyo (JP); Akira Yajima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/264,222

(22) Filed: Sep. 13, 2016

(65) Prior Publication Data

US 2017/0005048 A1 Jan. 5, 2017

Related U.S. Application Data

(60) Continuation of application No. 13/229,887, filed on Sep. 12, 2011, now Pat. No. 9,466,559, which is a
(Continued)

(30) Foreign Application Priority Data

Dec. 3, 2008 (JP) .................................. 2008-308585
Aug. 18, 2009 (JP) .................................. 2009-188913

(51) Int. Cl.
*H01L 23/00* (2006.01)
*H01L 25/065* (2006.01)
(Continued)

(52) U.S. Cl.
CPC ............ *H01L 24/05* (2013.01); *H01L 21/565* (2013.01); *H01L 23/485* (2013.01);
(Continued)

(58) Field of Classification Search
None
See application file for complete search history.

(56) References Cited

U.S. PATENT DOCUMENTS 4,920,074 A * 4/1990 Shimizu .............. H01L 21/4821
228/180.21
5,631,499 A * 5/1997 Hosomi ................. H01L 24/11
257/737
(Continued)

FOREIGN PATENT DOCUMENTS

CN 1643684 A 7/2005
JP 60-054462 3/1985
(Continued)

OTHER PUBLICATIONS

Office Action, dated Aug. 24, 2016, in Chinese Application No. 201310725962.9.
(Continued)

*Primary Examiner* — Davienne N Monbleau
*Assistant Examiner* — Scott R Wilson
(74) *Attorney, Agent, or Firm* — SGPatents PLLC

(57) ABSTRACT

In a method of manufacturing a semiconductor device, a semiconductor chip has first and second pads, a passivation film formed such that respective parts of the first and second pads are exposed, a first surface-metal-layer provided on the part of the first pad and a part of the passivation film, and a second surface-metal-layer provided on the part of the second pad and another part of the passivation film. Respective wires are electrically connected to the first and second surface-metal-layers. The semiconductor chip and the respective wires are then sealed with a resin.

20 Claims, 31 Drawing Sheets

Related U.S. Application Data division of application No. 12/628,869, filed on Dec. 1, 2009, now Pat. No. 8,063,489.

(51) Int. Cl.
| | |
|---|---|
| *H01L 23/485* | (2006.01) |
| *H01L 23/498* | (2006.01) |
| *H01L 21/56* | (2006.01) |
| *H01L 21/66* | (2006.01) |

(52) U.S. Cl.
CPC ........ *H01L 23/49816* (2013.01); *H01L 24/06* (2013.01); *H01L 24/12* (2013.01); *H01L 24/16* (2013.01); *H01L 24/46* (2013.01); *H01L 24/48* (2013.01); *H01L 24/49* (2013.01); *H01L 24/81* (2013.01); *H01L 24/85* (2013.01); *H01L 25/0657* (2013.01); *H01L 22/32* (2013.01); *H01L 24/45* (2013.01); *H01L 24/73* (2013.01); *H01L 24/78* (2013.01); *H01L 2224/02166* (2013.01); *H01L 2224/02205* (2013.01); *H01L 2224/0347* (2013.01); *H01L 2224/0401* (2013.01); *H01L 2224/04042* (2013.01); *H01L 2224/05027* (2013.01); *H01L 2224/0568* (2013.01); *H01L 2224/05082* (2013.01); *H01L 2224/05083* (2013.01); *H01L 2224/05084* (2013.01); *H01L 2224/05124* (2013.01); *H01L 2224/05144* (2013.01); *H01L 2224/05147* (2013.01); *H01L 2224/05155* (2013.01); *H01L 2224/05157* (2013.01); *H01L 2224/05164* (2013.01); *H01L 2224/05166* (2013.01); *H01L 2224/05169* (2013.01); *H01L 2224/05173* (2013.01); *H01L 2224/05181* (2013.01); *H01L 2224/05184* (2013.01); *H01L 2224/05553* (2013.01); *H01L 2224/05554* (2013.01); *H01L 2224/05558* (2013.01); *H01L 2224/05564* (2013.01); *H01L 2224/05568* (2013.01); *H01L 2224/05572* (2013.01); *H01L 2224/05583* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/06183* (2013.01); *H01L 2224/1134* (2013.01); *H01L 2224/13099* (2013.01); *H01L 2224/13144* (2013.01); *H01L 2224/13147* (2013.01); *H01L 2224/16225* (2013.01); *H01L 2224/2919* (2013.01); *H01L 2224/29198* (2013.01); *H01L 2224/32145* (2013.01); *H01L 2224/32225* (2013.01); *H01L 2224/32245* (2013.01); *H01L 2224/4502* (2013.01); *H01L 2224/45124* (2013.01); *H01L 2224/45144* (2013.01); *H01L 2224/45147* (2013.01); *H01L 2224/45164* (2013.01); *H01L 2224/45169* (2013.01); *H01L 2224/46* (2013.01); *H01L 2224/4807* (2013.01); *H01L 2224/4868* (2013.01); *H01L 2224/4878* (2013.01); *H01L 2224/4888* (2013.01); *H01L 2224/48095* (2013.01); *H01L 2224/48145* (2013.01); *H01L 2224/48158* (2013.01); *H01L 2224/48247* (2013.01); *H01L 2224/48453* (2013.01); *H01L 2224/48465* (2013.01); *H01L 2224/48471* (2013.01); *H01L 2224/48507* (2013.01); *H01L 2224/48624* (2013.01); *H01L 2224/48639* (2013.01); *H01L 2224/48644* (2013.01); *H01L 2224/48647* (2013.01); *H01L 2224/48655* (2013.01); *H01L 2224/48664* (2013.01); *H01L 2224/48724* (2013.01); *H01L 2224/48739* (2013.01); *H01L 2224/48744* (2013.01); *H01L 2224/48747* (2013.01); *H01L 2224/48755* (2013.01); *H01L 2224/48764* (2013.01); *H01L 2224/48824* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/49171* (2013.01); *H01L 2224/49175* (2013.01); *H01L 2224/73204* (2013.01); *H01L 2224/73265* (2013.01); *H01L 2224/78301* (2013.01); *H01L 2224/81193* (2013.01); *H01L 2224/81801* (2013.01); *H01L 2224/83101* (2013.01); *H01L 2224/85181* (2013.01); *H01L 2224/85186* (2013.01); *H01L 2224/85205* (2013.01); *H01L 2224/85207* (2013.01); *H01L 2224/85439* (2013.01); *H01L 2224/85444* (2013.01); *H01L 2224/85464* (2013.01); *H01L 2225/0651* (2013.01); *H01L 2225/06517* (2013.01); *H01L 2924/00011* (2013.01); *H01L 2924/014* (2013.01); *H01L 2924/01004* (2013.01); *H01L 2924/01005* (2013.01); *H01L 2924/0105* (2013.01); *H01L 2924/01006* (2013.01); *H01L 2924/01011* (2013.01); *H01L 2924/01013* (2013.01); *H01L 2924/01014* (2013.01); *H01L 2924/01015* (2013.01); *H01L 2924/01018* (2013.01); *H01L 2924/01019* (2013.01); *H01L 2924/01022* (2013.01); *H01L 2924/01024* (2013.01); *H01L 2924/01025* (2013.01); *H01L 2924/01028* (2013.01); *H01L 2924/01029* (2013.01); *H01L 2924/01033* (2013.01); *H01L 2924/01042* (2013.01); *H01L 2924/01045* (2013.01); *H01L 2924/01046* (2013.01); *H01L 2924/01047* (2013.01); *H01L 2924/01061* (2013.01); *H01L 2924/01065* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01327* (2013.01); *H01L 2924/04941* (2013.01); *H01L 2924/04953* (2013.01); *H01L 2924/05042* (2013.01); *H01L 2924/078* (2013.01); *H01L 2924/09701* (2013.01); *H01L 2924/10253* (2013.01); *H01L 2924/12042* (2013.01); *H01L 2924/1306* (2013.01); *H01L 2924/13091* (2013.01); *H01L 2924/14* (2013.01); *H01L 2924/15311* (2013.01); *H01L 2924/15787* (2013.01); *H01L 2924/15788* (2013.01); *H01L 2924/181* (2013.01); *H01L 2924/19041* (2013.01); *H01L 2924/19043* (2013.01); *H01L 2924/3511* (2013.01)

(56) References Cited

U.S. PATENT DOCUMENTS

| | | | | |
|---|---|---|---|---|
| 6,042,953 | A | * | 3/2000 | Yamaguchi ............. H01L 24/11 257/E21.508 |
| 6,127,724 | A | | 10/2000 | DiStefano |
| 6,384,486 | B2 | | 5/2002 | Zuniga et al. |
| 6,534,863 | B2 | | 3/2003 | Walker et al. |
| 6,798,050 | B1 | | 9/2004 | Homma et al. |
| 2001/0008311 | A1 | | 7/2001 | Harada et al. |
| 2002/0017719 | A1 | * | 2/2002 | Taniguchi ............. H01L 24/10 257/723 |
| 2002/0044580 | A1 | | 4/2002 | Ohkubo et al. |
| 2002/0056901 | A1 | | 5/2002 | Ono et al. |
| 2002/0125584 | A1 | | 9/2002 | Umehara et al. |

(56) References Cited

U.S. PATENT DOCUMENTS

| | | | |
|---|---|---|---|
| 2002/0180064 A1* | 12/2002 | Hwan | H01L 23/66 257/778 |
| 2002/0190395 A1 | 12/2002 | Fang et al. | |
| 2003/0080428 A1* | 5/2003 | Izumitani | H01L 23/5226 257/758 |
| 2004/0222520 A1 | 11/2004 | Jin | |
| 2005/0001314 A1 | 1/2005 | Tanaka et al. | |
| 2005/0173791 A1 | 8/2005 | Hsu et al. | |
| 2005/0242426 A1* | 11/2005 | Kwon | H01L 24/91 257/690 |
| 2005/0253236 A1* | 11/2005 | Nakayama | H01L 24/05 257/678 |
| 2005/0277283 A1 | 12/2005 | Lin et al. | |
| 2006/0214296 A1* | 9/2006 | Okamoto | H01L 24/11 257/751 |
| 2009/0242268 A1 | 10/2009 | Fukuda | |
| 2013/0313708 A1 | 11/2013 | Shigihara et al. | |

FOREIGN PATENT DOCUMENTS

| | | |
|---|---|---|
| JP | 08-330310 A | 12/1996 |
| JP | 2000-164623 A | 6/2000 |
| JP | 2000-183104 A | 6/2000 |
| JP | 2001-093928 A | 4/2001 |
| JP | 2001-308139 A | 11/2001 |
| JP | 2003-068738 A | 3/2003 |
| JP | 2004-533711 A | 11/2004 |
| JP | 2005-019493 A | 1/2005 |
| JP | 2005-527968 A | 9/2005 |
| WO | WO 2003/079437 A2 | 9/2003 |

OTHER PUBLICATIONS

Office Action dated Dec. 18, 2015, in Chinese Patent Application No. 2013610725962.9.

Office Action dated Jul. 2, 2015, in Japanese Patent Application No. 2014-193557.

Office Action dated Jul. 31, 2014, in Japanese Patent Application No. 2013-156382.

Office Action dated Mar. 21, 2013, in Japanese Patent Application No. 2009-188913.

Office Action dated Mar. 5, 2015, in Japanese Patent Application No. 2013-156382.

Office Action dated Mar. 8, 2013, is Chinese Patent Application No. 200910224397.1.

Office Action dated Oct. 12, 2013, in Chinese Patent Application No. 200910224397.1.

Wikipedia—Solder [online]. May 17, 2011. Retrieved from the Internet <URL: http://en.wikipedia.org/wiki/Solder>.

* cited by examiner

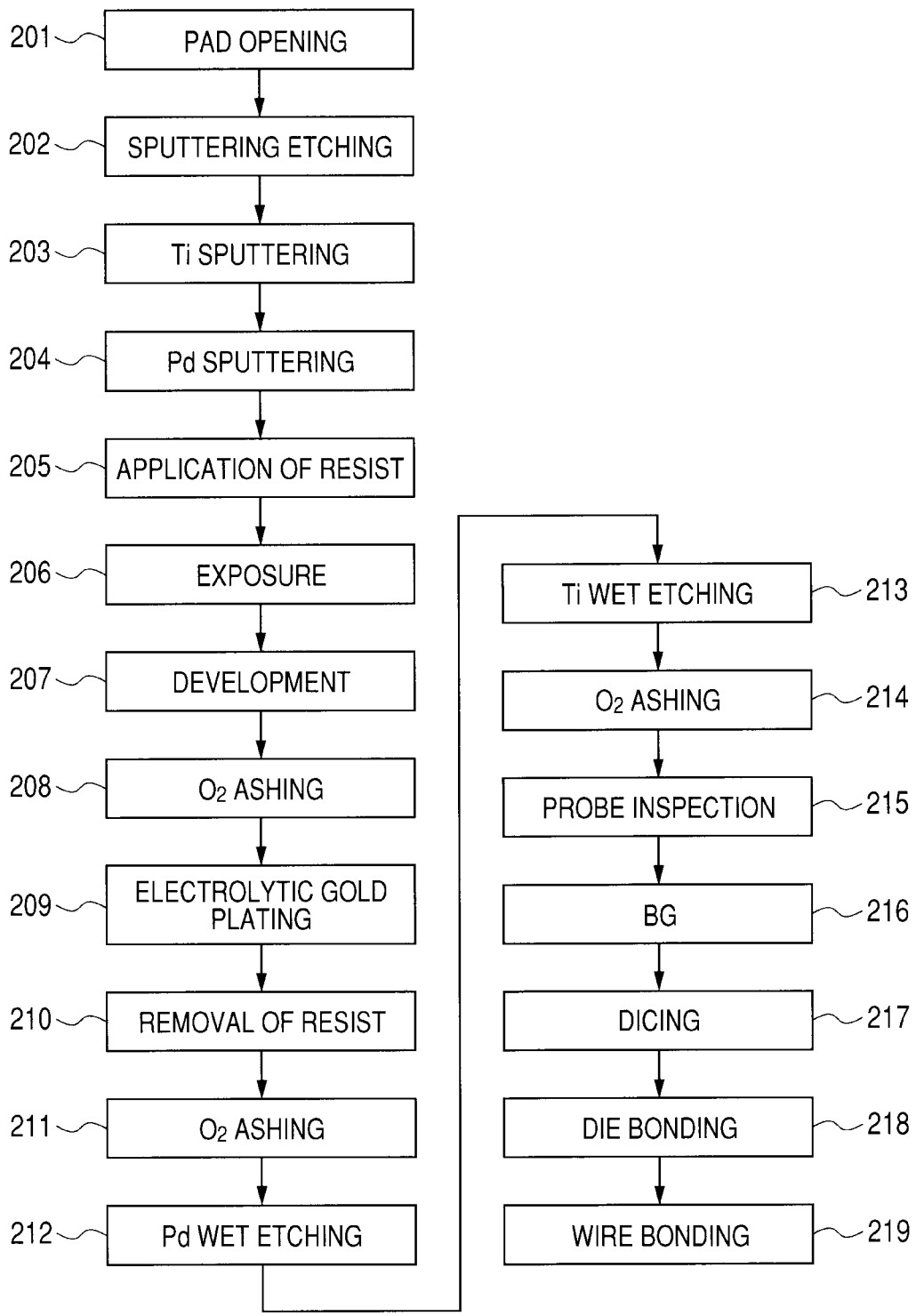

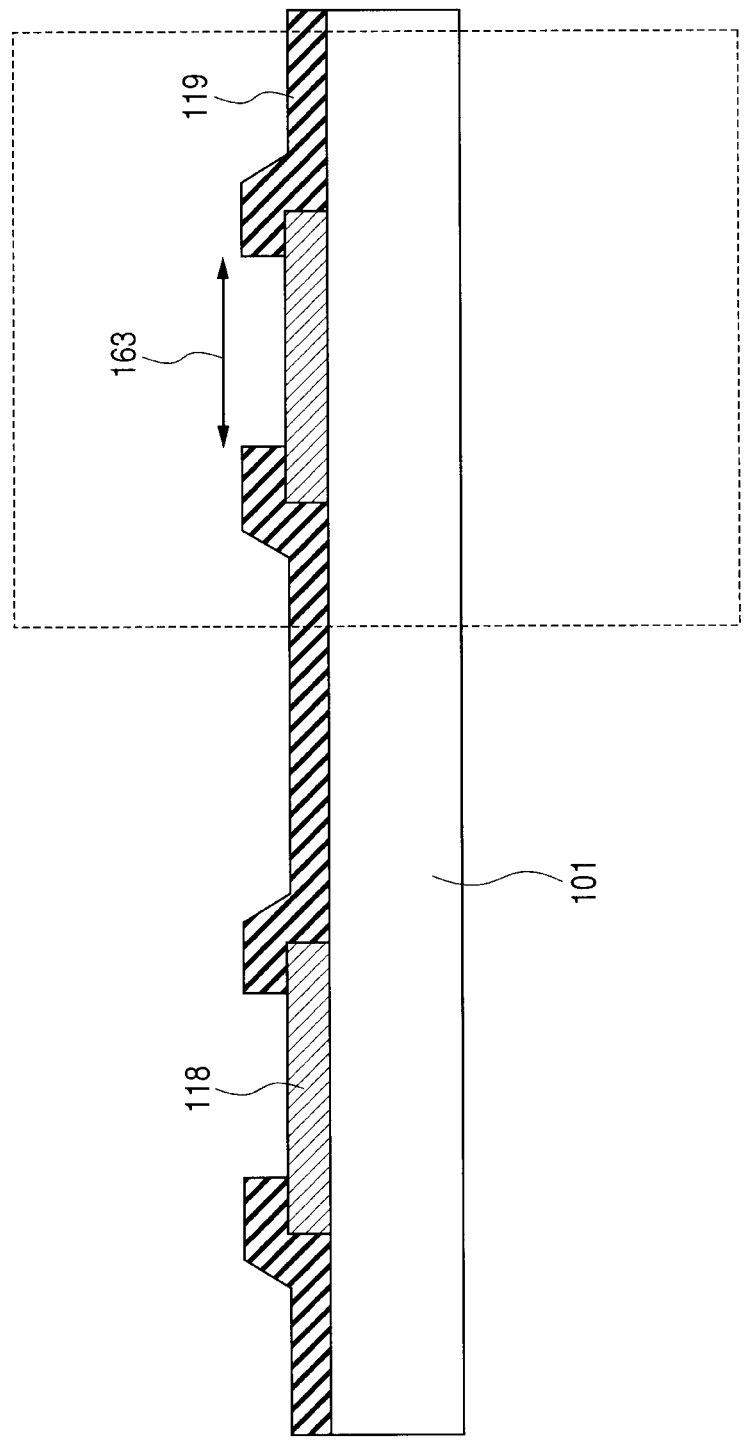

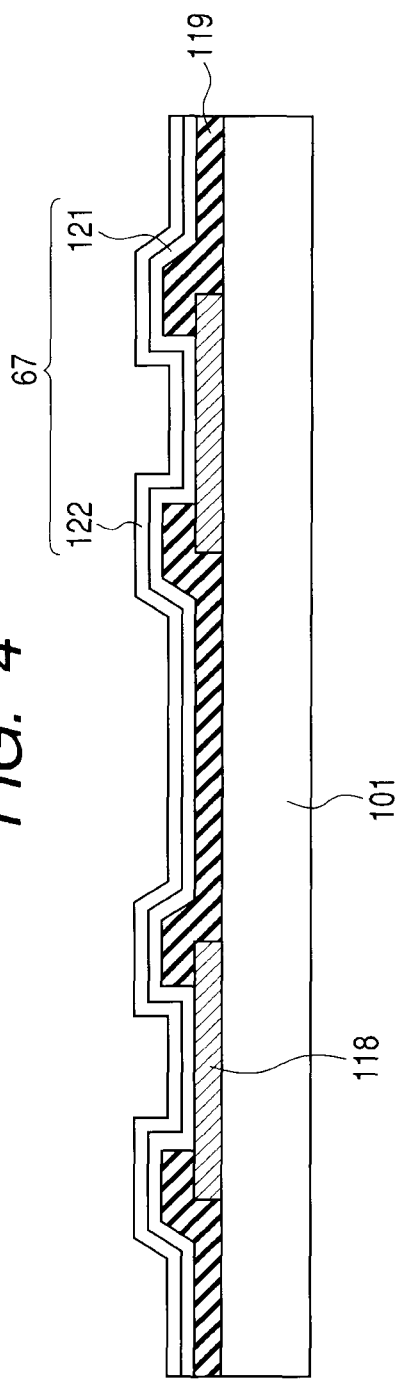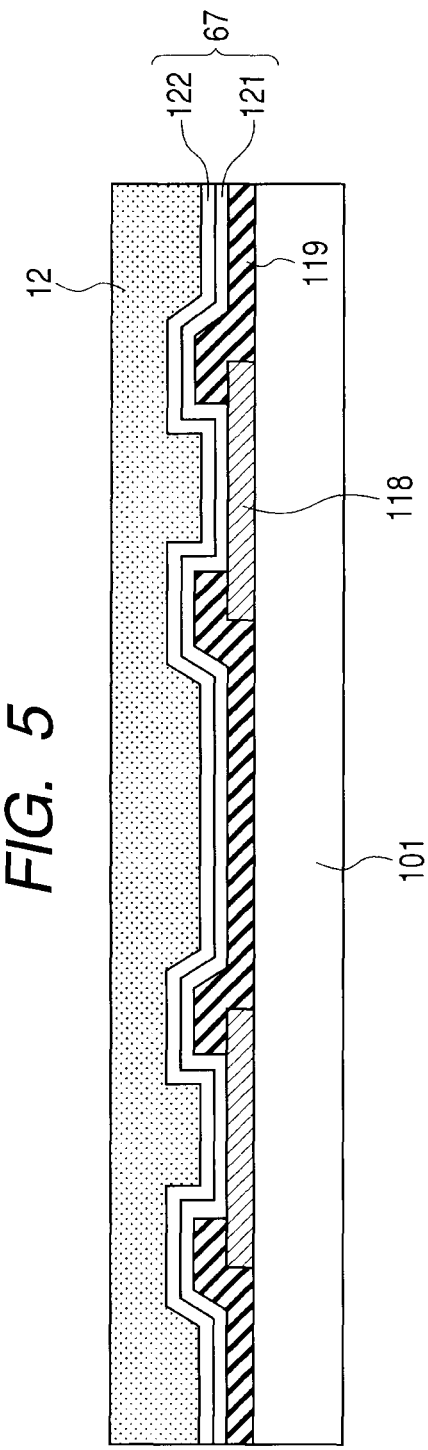

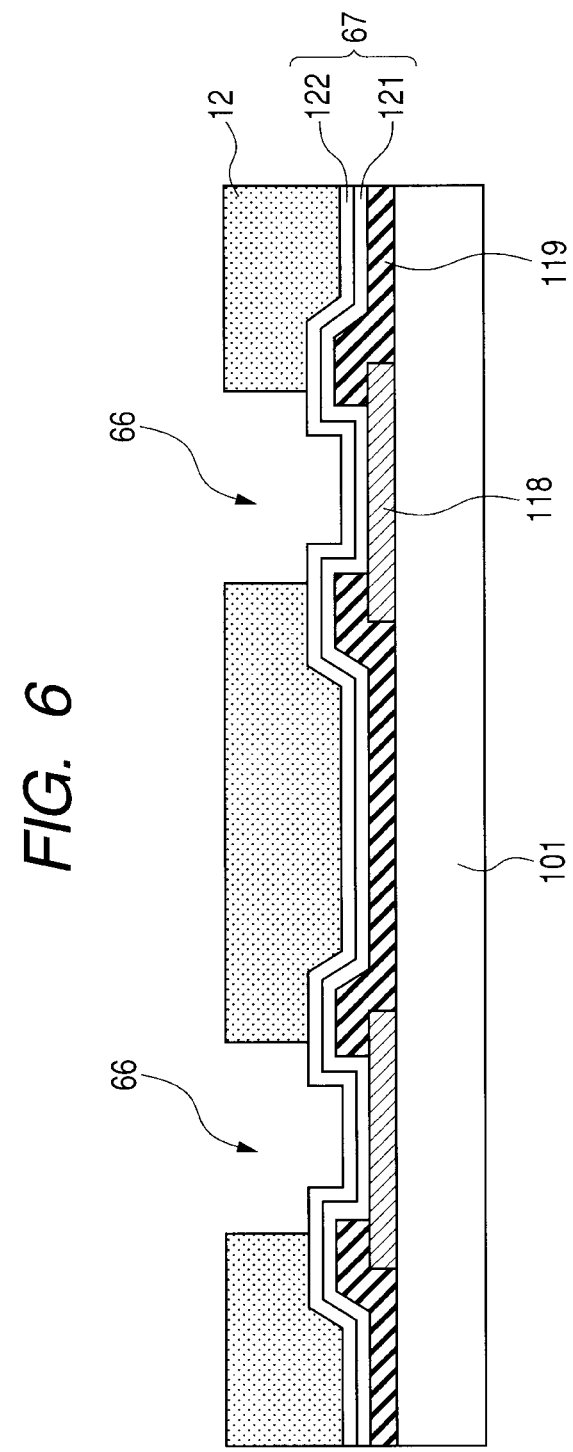

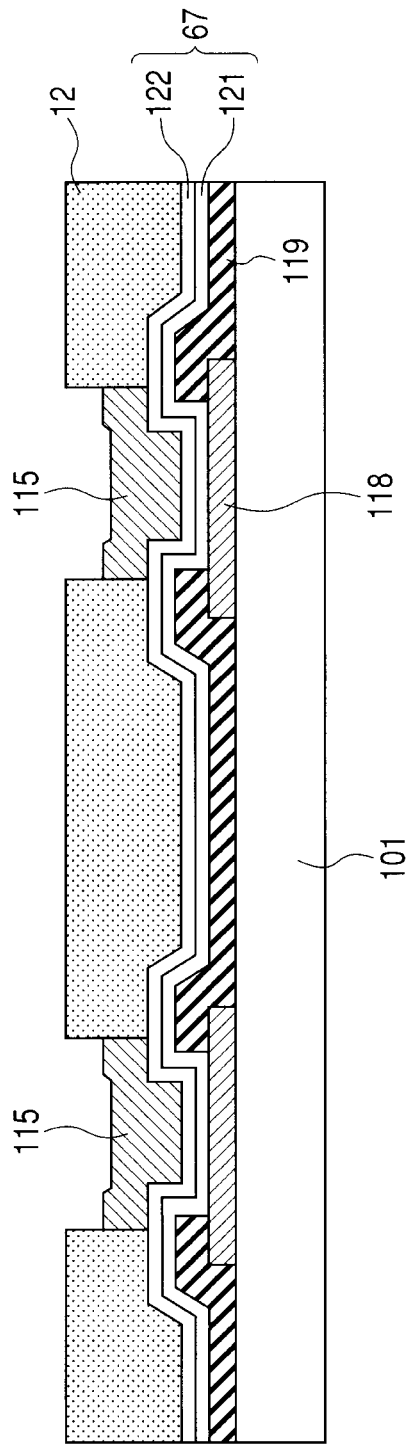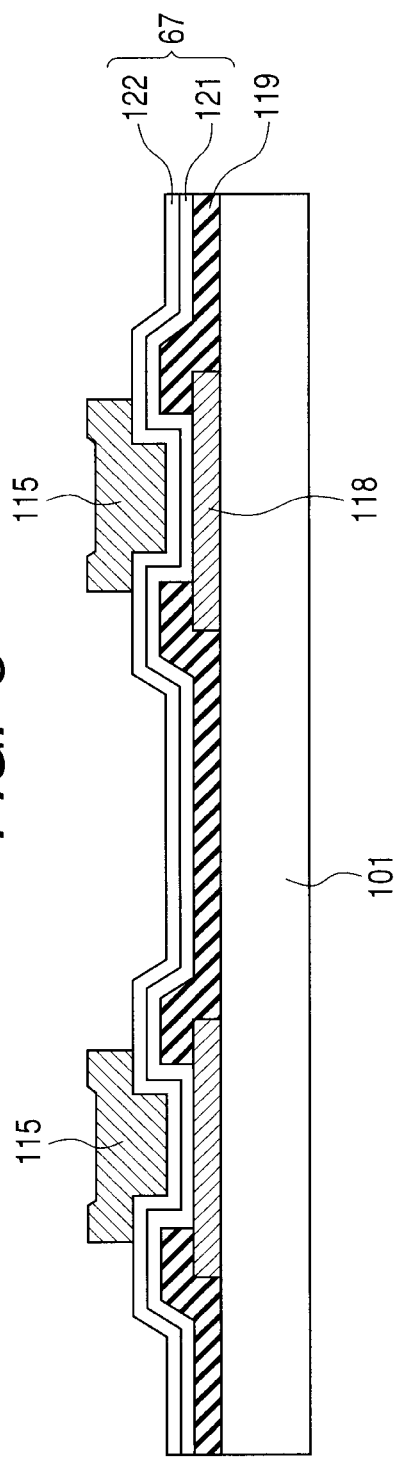

SEMICONDUCTOR INTEGRATED CIRCUIT DEVICE

CROSS-REFERENCE TO RELATED APPLICATIONS

The disclosure of Japanese Patent Application No. 2008-308585 filed on Dec. 3, 2008 and Japanese Patent Application No. 2009-188913 filed on Aug. 18, 2009 each including the specification, drawings and abstract are incorporated herein by reference in its entirety.

BACKGROUND OF THE INVENTION

The present invention relates to a technique effectively applied to interconnection technology between a pad electrode on a semiconductor chip in a semiconductor integrated circuit device (semiconductor device or electronic circuit device) and an external device.

Published Japanese translation of a PCT application No. 2004-533711 (Patent Document 1) or U.S. Pat. No. 6,534,863 (Patent Document 2) discloses a technique for bonding a gold wire to a pad comprised of a TaN (bonding layer)/Ta (barrier layer)/Cu (seed layer)/Ni (first electroplated layer)/Au (second electroplated layer), or the like from the lower layer side, instead of an aluminum pad whose surface tends to be easily oxidized, in a semiconductor device with a copper wiring structure.

RELATED ART DOCUMENTS

Patent Documents

[Patent Document 1]
Published Japanese translation of a PCT application No. 2004-533711
[Patent Document 2]
U.S. Pat. No. 6,534,863

SUMMARY OF THE INVENTION

In semiconductor circuit devices for vehicle use or the like, an aluminum pad on a semiconductor chip and an external device are generally coupled to each other by wire bonding or the like using a gold wire and the like for the convenience of mounting. Such a semiconductor integrated circuit device, however, causes connection failure, such as Kirkendall Void, due to the interaction between aluminum and gold in use for a long time at a relatively high temperature (about 150 degrees. C).

The invention of the present application is to solve the forgoing problems.

It is an object of the invention to provide a semiconductor integrated circuit device with high reliability.

The above, other objects, and novel features of the invention will become apparent from the description of the present specification with reference to the accompanying drawings.

The following briefly describes the summary of representative embodiments of the invention disclosed in the present application.

That is, in the invention of the present application, a gold-based surface metal layer is provided over an aluminum or copper-based bonding pad on a semiconductor chip via a barrier metal film. The bonding pad is a part of a semiconductor integrated circuit device (semiconductor device or electron circuit device). And a gold or copper-based bonding wire connection portion or bonding ball is provided for connection to an external portion.

The effects obtained by the representative embodiments of the invention disclosed in the present application will be briefly described in the following.

That is, since the gold or copper-based bonding wire or bonding ball is bonded to the aluminum or copper-based bonding pad via the gold-based surface film or layer, even the use of the semiconductor integrated circuit device for a long time at a relatively high temperature does not cause the failure of connection due to the interaction between gold and aluminum or the like.

BRIEF DESCRIPTION OF THE DRAWINGS

FIG. 2 is a process flowchart showing the flow from the pad opening step to a wire bonding process during a manufacturing procedure of the semiconductor integrated circuit device in the embodiment of the present application, FIG. 3 is a process flowchart showing a device section (at the time of completion of the pad opening step) of the semiconductor chip (corresponding to a section taken along the line X-X' of FIG. 18) of the semiconductor integrated circuit device in the embodiment of the present application, FIG. 4 is a process flowchart showing a device section (in a barrier film formation step) of the semiconductor chip (corresponding to a section taken along the line X-X' of FIG. 19) of the semiconductor integrated circuit device in the embodiment of the present application, FIG. 5 is a process flowchart showing a device section (in a resist film application step) of the semiconductor chip (corresponding to a section taken along the line X-X' of FIG. 20) of the semiconductor integrated circuit device in the embodiment of the present application, FIG. 6 is a process flowchart showing a device section (in a resist film opening step) of the semiconductor chip (corresponding to a section taken along the line X-X' of FIG. 21) of the semiconductor integrated circuit device in the embodiment of the present application, FIG. 7 is a process flowchart showing a device section (in a gold plating step) of the semiconductor chip (corresponding to a section taken along the line X-X' of FIG. 22) of the semiconductor integrated circuit device in the embodiment of the present application, FIG. 8 is a process flowchart showing a device section (in a resist removal step) of the semiconductor chip (corresponding to a section taken along the line X-X' of FIG. 23) of the semiconductor integrated circuit device in the embodiment of the present application.

DETAILED DESCRIPTION OF THE PREFERRED EMBODIMENTS

Summary of Preferred Embodiments

Figure 1:
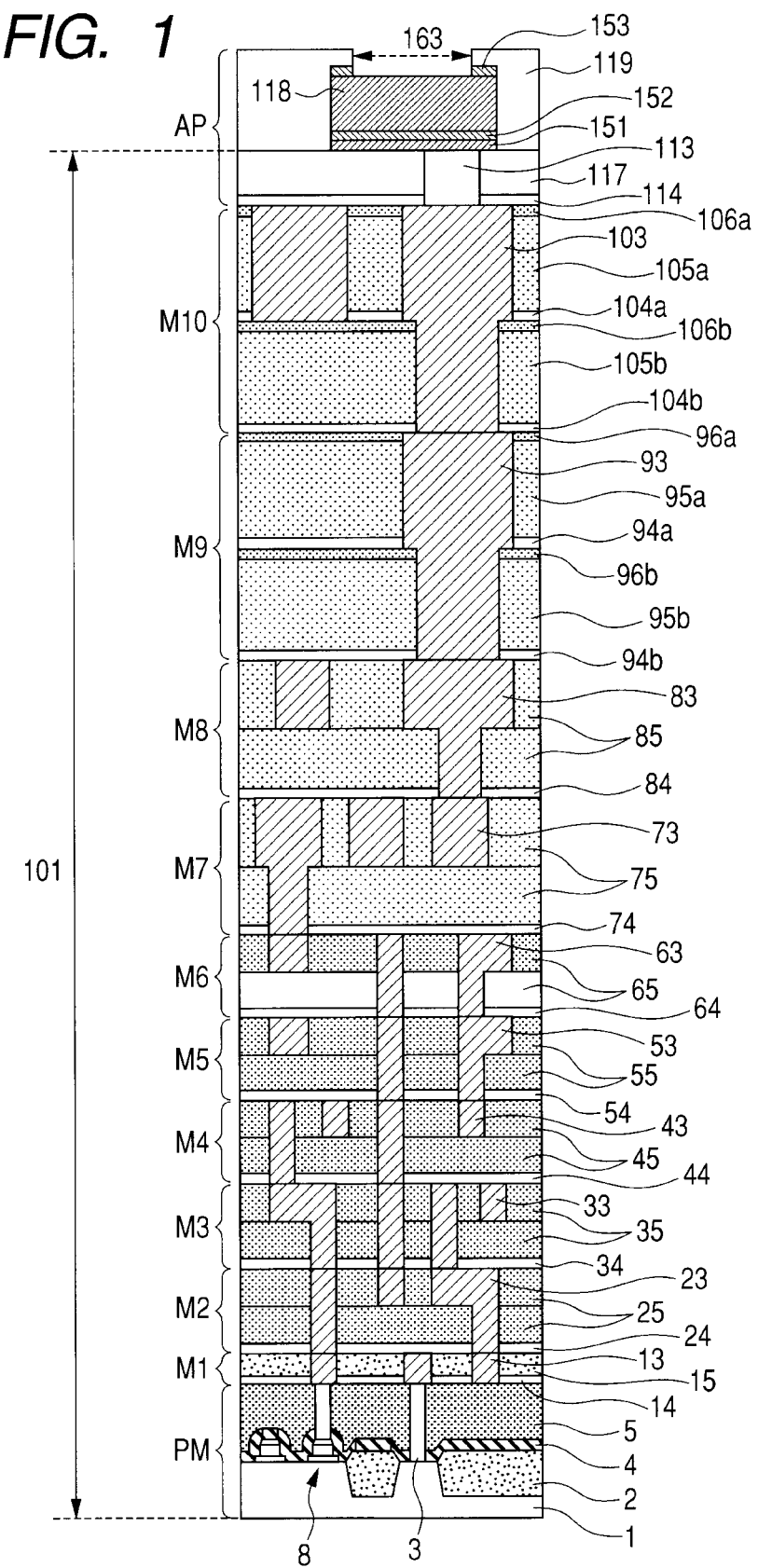
FIG. 1 is a longitudinal device structural diagram (corresponding to a part enclosed by a broken line shown in FIG. 3) of a semiconductor chip in a semiconductor integrated circuit device at the time of completion of a pad opening step according to one embodiment of the present application.

First, representative preferred embodiments of the invention disclosed in the present application will be summarized below.

1. A semiconductor integrated circuit device includes: (a) an aluminum or copper-based pad electrode provided over a device surface of a semiconductor chip; (b) a barrier metal film provided over the pad electrode; (c) a surface metal film provided over the barrier metal film, and including gold as a principal component; and (d) a bonding ball or bonding wire bonded to the surface metal film, and including gold or copper as a principal component.

2. In the semiconductor integrated circuit device according to Item 1, a thickness of the surface metal film is larger than that of the barrier metal film.

3. In the semiconductor integrated circuit device according to Item 1 or 2, the surface metal film is formed by electrolytic plating or sputtering.

4. In the semiconductor integrated circuit device according to any one of Items 1 to 3, the surface metal film is formed by the electrolytic plating.

5. In the semiconductor integrated circuit device according to any one of Items 1 to 4, an area of the surface metal film is larger than that of an opening of an insulating film over the pad electrode.

6. In the semiconductor integrated circuit device according to any one of Items 1 to 5, an area of the pad electrode is larger than that of the surface metal film.

7. In the semiconductor integrated circuit device according to any one of Items 1 to 6, the opening of the insulating film over the pad electrode is located within the surface metal film as viewed planarly.

8. The semiconductor integrated circuit device according to any one of Items 1 to 7, the surface metal film is located within the pad electrode as viewed planarly.

9. The semiconductor integrated circuit device according to any one of Items 1 to 4, the surface metal film extends up to an area without the pad electrode.

10. In the semiconductor integrated circuit device according to any one of Items 1 to 9, the bonding ball is a ball portion of a bonding wire.

11. In the semiconductor integrated circuit device according to any one of Items 1 to 10, the bonding ball is comprised of a member including gold as a principal component.

12. In the semiconductor integrated circuit device according to any one of Items 1 to 10, the bonding ball is comprised of a member including copper as a principal component.

13. In the semiconductor integrated circuit device according to any one of Items 1 to 12, the pad electrode is an aluminum or copper-based pad electrode.

14. In the semiconductor integrated circuit device according to any one of Items 1 to 13, the barrier metal film includes titanium as a principal component.

15. In the semiconductor integrated circuit device according to any one of Items 1 to 13, the barrier metal film includes one selected from the group comprising titanium, chrome, titanium nitride, and tungsten nitride as a principal component.

16. The semiconductor integrated circuit device according to any one of Items 1 to 15 further includes (e) a seed metal film provided between the barrier metal film and the surface metal film.

17. In the semiconductor integrated circuit device according to item 16, the seed metal film includes palladium as a principal component.

18. In the semiconductor integrated circuit device according to item 16, the seed metal film includes one selected from the group comprising copper, gold, nickel, platinum, rhodium, molybdenum, tungsten, chrome, and tantalum.

19. In the semiconductor integrated circuit device according to any one of Items 1 to 18, the pad electrode has a substantially square shape as viewed planarly.

20. In the semiconductor integrated circuit device according to any one of Items 1 to 18, the pad electrode has a substantially rectangular shape as viewed planarly.

Next, other preferred embodiments of the invention disclosed in the present application will be summarized below.

1. A semiconductor integrated circuit device includes: (a) a wiring board; (b) a first semiconductor chip fixed to the wiring board or to a first electronic element provided over the wiring board; (c) an aluminum or copper-based pad electrode provided over a device surface of the first semiconductor chip; (d) a barrier metal film provided over the pad electrode; (e) a seed metal film provided over the barrier metal film; (f) a surface metal film provided over the seed metal film by electrolytic plating and including gold as a principal component; (g) an external metal electrode provided outside the first semiconductor chip; and (h) a bonding wire provided for coupling the surface metal film to the external metal electrode, and including gold as a principal component.

2. In the semiconductor integrated circuit device according to Item 1, the pad electrode is an aluminum-based pad electrode.

3. In the semiconductor integrated circuit device according to Item 1 or 2, the barrier metal film includes titanium as a principal component.

4. In the semiconductor integrated circuit device according to any one of Items 1 to 3, the seed metal film includes palladium as a principal component.

5. In the semiconductor integrated circuit device according to any one of Items 1, 2, and 4, the barrier metal film includes one selected from the group comprising titanium, chrome, titanium nitride, and tungsten nitride.

6. In the semiconductor integrated circuit device according to any one of Items 1 to 3, and 5, the seed metal film includes one selected from the group comprising copper, gold, nickel, platinum, rhodium, molybdenum, tungsten, chromium, and tantalum as a principal component.

7. In the semiconductor integrated circuit device according to any one of Items 1 to 6, the first semiconductor chip is fixed to the wiring board.

8. In the semiconductor integrated circuit device according to any one of Items 1 to 6, the first semiconductor chip is fixed to the first electronic element over the wiring board.

9. In the semiconductor integrated circuit device according to any one of Items 1 to 8, the external metal electrode is located over the wiring board.

10. In the semiconductor integrated circuit device according to any one of Items 1 to 8, the external metal electrode is located over the first electronic element located over the wiring board.

11. In the semiconductor integrated circuit device according to any one of Items 1 to 10, the bonding wire has a first bonding point located on the surface metal film side.

12. In the semiconductor integrated circuit device according to any one of Items 1 to 10, the bonding wire has a second bonding point located on the surface metal film side.

13. In the semiconductor integrated circuit device according to any one of Items 1 to 12, a metal film including gold, silver, or palladium as a principal component is provided at a surface of the external metal electrode.

14. A method for manufacturing a semiconductor integrated circuit device is provided. The semiconductor integrated circuit device includes: (a) a wiring board; (b) a first semiconductor chip fixed to the wiring board or to a first electronic element provided over the wiring board; (c) an aluminum or copper-based pad electrode provided over a device surface of the first semiconductor chip; (d) a barrier metal film provided over the pad electrode; (e) a seed metal film provided over the barrier metal film; (f) a surface metal film provided over the seed metal film and including gold as a principal component; (g) an external metal electrode provided outside the first semiconductor chip; and (h) a bonding wire provided for coupling the surface metal film and the external metal electrode to each other, and including gold as a principal component. The method includes the steps of: (I) forming the seed metal film over the substantially entire surface of a semiconductor wafer; (II) forming a resist film with an opening over the seed metal film; and (III) forming the surface metal film by forming a plated layer at the opening by electrolytic plating.

Further, other preferred embodiments of the invention disclosed in the present application will be summarized below.

1. A semiconductor integrated circuit device includes: (a) an aluminum or copper-based pad electrode provided over a device surface of a semiconductor chip; (b) a barrier metal film provided over the pad electrode; (c) a surface metal film provided over the barrier metal film by electrolytic plating, and including gold as a principal component; and (d) a bonding ball, or bonding wire provided over the surface metal film and including gold or copper as a principal component.

2. In the semiconductor integrated circuit device according to Item 1, the pad electrode is an aluminum-based pad electrode.

3. In the semiconductor integrated circuit device according to Item 1 or 2, the barrier metal film includes titanium as a principal component.

4. The semiconductor integrated circuit device according to any one of Items 1 to 3 further includes: (e) a seed metal film provided between the barrier metal film and the surface metal film.

5. In the semiconductor integrated circuit device according to Item 4, the seed metal film includes palladium as a principal component.

6. In the semiconductor integrated circuit device according to any one of Items 1, 2, 4, and 5, the barrier metal film includes one selected from the group comprising titanium, chrome, titanium nitride, and tungsten nitride as a principal component.

7. In the semiconductor integrated circuit device according to Item 4 or 6, the seed metal film includes one selected from the group comprising copper, gold, nickel, platinum, rhodium, molybdenum, tungsten, chromium, and tantalum as a principal component.

Explanation of Description Format, Basic Terms, and Usage in Present Application 1. The description of the following preferred embodiments in the present application may be divided into sections for convenience if necessary, but these embodiments are not separated from each other independently except when specified otherwise. One of the embodiments has relationships with respect to the other, including each part of a corresponding single example, a detailed description of a part of the other, and a modified example or the like of a part or all of the other. The repeated description of the same part will be omitted in principle. Further, each component of the embodiments is not essential except when specified otherwise, except when limited to the specific number of the components in theory, and except when clearly defined otherwise by the context.

Further, the term "semiconductor integrated circuit device" as used in the present application means a device mainly including various kinds of transistors (active elements), such as a resistor or a capacitor, integrated on a semiconductor chip or the like (for example, a monocrystalline silicon substrate). Various types of representative transistors can include, for example, a metal insulator semiconductor field effect transistor (MISFET), typified by a metal oxide semiconductor field effect transistor (MOSFET). At this time, the typical integrated circuit structure can include, for example, a complementary metal insulator semiconductor (CMIS) type integrated circuit, typified by a complementary metal oxide semiconductor type integrated circuit with a combination of an N-channel type MISFET and a P-channel type MISFET.

A wafer process of a modern semiconductor integrated circuit device, that is, a large scale integration (LSI), can be normally classified broadly into a front end of line (FEOL) process and a back end of line (BEOL) process. The FEOL process involves a delivery process of a silicon wafer as raw material, and a premetal process (including formation of an interlayer insulating film between a lower end of a M1 wiring layer and a gate electrode structure, formation of contact holes, formation of a tungsten plug, embedding, and the like). The BEOL process involves a formation process of the M1 wiring layer, and a formation process of a pad opening in a final passivation film on the aluminum-based pad electrode (which may also include a wafer level package process). The gate electrode patterning process and the contact hole formation process among the FEOL process are a microfabrication process which requires a very fine process. In contrast, in the BEOL process, a via and trench formation process, especially, the formation of local wiring at a relatively low layer (for example, fine embedded wiring layers from M1 to M3 in the case of an embedded wiring structure with a four-layered structure, or those from M1 to M5 in the case of an embedded wiring structure with ten layers), or the like requires a very fine process. It is noted that "MN (normally, N ranging from about 1 to 15 (N=1 to 15)" represents an N-th wiring layer counted from the lower side. The reference character M1 represents a first wiring layer, and the reference character M3 represents a third wiring layer.

2. Likewise, in the description of the embodiments and the like, the phrase "X made of A" about material, component, or the like does not exclude a member containing an element other than A as a principal component, except when specified otherwise, and except when indicated from the context. For example, as to a component, the above phrase means "X containing A as a principal component" or the like. It is apparent that for example, the term "silicon member" or the like is not limited to pure silicon, and may have a member containing a multicomponent alloy including SiGe alloy or other silicon materials as a principal component, and other additives or the like. Likewise, the term "silicon oxide film", "silicon-oxide-based insulating film", or the like includes a film made of relatively pure undoped silicon dioxide. It is apparent that the above term also includes a thermally-oxidized film or CVD oxide film which is made of fluorosilicate glass (FSG), TEOS-based silicon oxide, silicon oxicarbide (SiOC), or carbon-doped silicon oxide, or organosilicate glass (OSG), phosphorus silicate glass (PSG), borophosphosilicate glass (BPSG), or the like; a coating type silicon oxide film made of spin on glass (SOG), nano-clustering silica (NSC), or the like; a silica-based Low-k insulating film (porous insulating film) made of the same member as that described above having holes; and a composite film or the like containing the above-mentioned material as a principal component and another silicon-based insulating film.

Silicon-based insulating films generally used in the field of semiconductor devices include a silicon-nitride-based insulating film, in addition to the silicon-oxide-based insulating film. Materials belonging to such an insulating film are, for example, SiN, SiCN, SiNH, SiCNH, and the like. The term "silicon nitride" as used herein means both of SiN and SiNH except when specified otherwise. Likewise, the term "SiCN" as used herein means both of SiCN and SiCNH except when specified otherwise.

The insulating film made of SiC has properties similar to those of the insulating film made of SiN, but the insulating film made of SiON should often be classified as the silicon-oxide-based insulating film.

The silicon nitride film is used not only as an etching stopper film in a self-aligned contact (SAC) technique in many cases, but also as a stress applying film in a stress memorization technique (SMT).

Similarly, the terms "copper wiring", "aluminum wiring", "aluminum pad", "gold bump (gold surface film)", and the like mean not only a member comprised of pure material, but also a member including aluminum or gold as a principal component, that is, "copper-based wiring", "aluminum-based wiring", "aluminum-based pad", and "gold-based bump (gold-based surface metal film)", respectively. These expressions mean that a main part of the above member is comprised of such a material as the principal component. It is apparent that these expressions do not necessarily mean the entire member consisting of such a material.

The same goes for the terms "barrier metal", "seed metal", and the like.

3. Likewise, it is apparent that preferred examples of diagrams, positions, properties, and the like are described in the embodiments, but the invention is not strictly limited thereto except when specified otherwise, and except when indicated otherwise from the context.

4. Further, when referring to a specific value or quantity, the invention may have a value exceeding the specific value, or may have a value less than the specific value except when specified otherwise, except when the invention is not limited to the value in theory, and except when indicated otherwise from the context.

5. The term "wafer" generally indicates a single crystal silicon wafer over which a semiconductor integrated circuit device (note that the same goes for a semiconductor device, and an electronic device) is formed, but may include a composite wafer of an insulating substrate, such as an epitaxial wafer, an SOI wafer, or a LCD glass substrate, and a semiconductor layer or the like.

6. The term "bonding pad" as used in the present application means an aluminum-based pad or the like on which a multilayer metal structure or bump structure (including an area ranging from a barrier metal film to a surface metal film) is mainly formed. Suitable materials for the bonding pad may include a copper-based material as well as an aluminum-based material.

7. In the present application, a terminal electrode (electrode for external coupling) is formed of gold or the like by electrolytic plating or the like on a bonding pad, and has a relatively thick (as compared to a barrier metal layer or the like positioned directly below the electrode). The terminal electrode, that is, "surface metal layer", which is not an inherent bump electrode for direct coupling, is often referred to as a "gold bump", "bump electrode" or "bump electrode layer", or the like for convenience, taking into consideration similarity of shape. The inherent bump electrode normally has a thickness of about 15 μm, whereas the surface metal layer normally has a thickness of about 1 to 5 μm. In an example where an electrolytic plated layer made of copper, nickel, or the like is formed relatively thickly under a gold layer as the surface metal layer, the whole surface metal layer including these layers as parts thereof has a thickness of about 15 μm in some cases.

The term "bonding ball" in ball bonding as used herein means a ball-shaped metal core or its deformed one formed at a first bonding point, and also a ball-shaped metal core or its deformed one, such as a stud bump, formed due to a bonding wire.

8. In the present application, the term "wiring board" as used herein includes not only a general-purpose organic wiring board (monolayer and multilayer) made of glass epoxy, or the like, but also a flexible wiring board, a ceramic wiring board, a glass wiring board, and the like. The term "electronic element" on the wiring board as used herein includes a semiconductor device, a semiconductor chip, other chip components (resistor, capacitor, and the like) and the like sealed in a package.

Further Detailed Description of the Preferred Embodiments

The preferred embodiments will be further described below in detail. In each drawing, the same or similar part is designated by the same or similar reference character or numeral, and a description thereof will not be repeated in principle.

1. Explanation of Device Cross-Sectional Structure in Completion of Pad Opening Process on Aluminum-based Pad in Semiconductor Integrated Circuit Device of One Embodiment of Present Application (mainly see FIG. 1)

FIG. 1 is a device cross-sectional view (at the time of completion of a pad opening process) showing one example of a cross-sectional structure of a device of the 65 nm technology node manufactured by a manufacturing method of a semiconductor integrated circuit device in one embodiment of the invention of the present application. Based on FIG. 1, the outline of the device structure of the semiconductor integrated circuit device in the embodiment of the present application will be described below.

As shown in FIG. 1, for example, a gate electrode 8 of a P-channel MOSFET or an N-channel MOSFET is formed on a device surface of a P-type monocrystalline silicon substrate 1 isolated by a shallow trench isolation (STI) type element isolation field insulating film 2. Over these components, a silicon nitride liner film 4 (for example, of about 30 nm in thickness) is formed to serve as an etching stopper film. On the film 4, a premetal interlayer insulating film 5 is formed in a thickness much larger than that of the silicon nitride liner film 4. The insulating film 5 is comprised of an ozone TEOS silicon oxide film (for example, of about 200 nm in thickness) formed as a lower layer by a thermal CVD method, and a plasma TEOS silicon oxide film (for example, of about 270 nm in thickness) formed as an upper layer. Tungsten plugs 3 are formed through the premetal insulating film. An area up to this point is a premetal region PM.

The first wiring layer M1 thereon is comprised of an insulating barrier film 14 made of a SiCN film (for example, of about 50 nm in thickness) as a lower layer, a plasma silicon oxide film 15 as a main interlayer insulating film (for example, of about 150 nm in thickness), and copper wirings 13 or the like embedded in wiring slots formed therein.

Second to sixth wiring layers M2, M3, M4, M5, and M6 thereon have substantially the same structure to one another. Each layer is comprised of a composite insulating barrier film (liner film) 24, 34, 44, 54, or 64 made of a SiCO film (for example, of about 30 nm in thickness)/SiCN film (for example, of about 30 nm in thickness) as a lower layer, and a main interlayer insulating film 25, 35, 45, 55, or 65 occupying most of an area as an upper layer. The main interlayer insulating film 25, 35, 45, 55, or 65 is comprised of a carbon-doped silicon oxide film, that is, a SiOC film (for example, of about 350 nm) as a lower layer, and a plasma TEOS silicon oxide film (for example, of about 80 nm in thickness) as a cap film. Copper embedded wirings 23, 33, 43, 53, or 63 including a copper plug and a copper wiring are formed through the interlayer insulating films.

Seventh and eighth wiring layers M7 and M8 thereon have substantially the same structure to each other. Each layer is comprised of an insulating barrier film 74 or 84 made of a SiCN film (for example, of about 70 nm in thickness) and the like as a lower layer, and a main interlayer insulating film 75 or 85 as an upper layer. The main interlayer insulating film 75 or 85 is comprised of a plasma TEOS silicon oxide film (for example, of about 250 nm in thickness) as a lower layer, a FSG film (for example, of about 300 nm in thickness), and a USG film (for example, of about 200 nm in thickness) as a cap film. Copper embedded wirings 73 or 83 including a copper plug and a copper wiring are formed through these interlayer insulating films.

Ninth and tenth wiring layers M9 and M10 thereon have substantially the same structure to each other. Each layer is divided into an interlayer part as a lower layer and an intralayer part as an upper layer. The interlayer insulating film is comprised of an insulating barrier film 94*b* or 104*b* made of a SiCN film (for example, of about 70 nm) or the like as a lower layer, and a main interlayer insulating film or the like as an upper layer. The main interlayer insulating film is comprised of a FSG film 95*b* or 105*b* (for example, of about 800 nm in thickness) as a lower layer, and a USG film 96*b* or 106*b* (for example, of about 100 nm in thickness) or the like which is a cap film as an upper layer. The intralayer insulating film is comprised of an insulating barrier film 94*a* or 104*a* made of a SiCN film (for example, of about 50 nm in thickness) or the like as a lower layer, and a main intralayer insulating film or the like as an upper layer. The main intralayer insulating film is comprised of a FSG film 95*a* or 105*a* (for example, of about 1200 nm in thickness) as a lower layer, and a USG film 96*a* or 106*a* (for example, of about 100 nm in thickness) which is a cap film as an upper layer. Copper embedded wirings 93 or 103 including a copper plug and a copper wiring are formed through the interlayer insulating film, the intralayer insulating film, and the like.

An uppermost wiring layer (pad layer) AP thereon is comprised of an insulating barrier film made of a SiCN film 114 and the like (for example, of about 100 nm in thickness) as a lower layer, a main interlayer insulating film made of a USG film 117 (for example, of about 900 nm in thickness) as an intermediate layer, and a final passivation film or the like made of a plasma SiN 119 (for example, of about 600 nm in thickness) as an outermost part. A tungsten plug 113 is provided through the interlayer insulating films, and an aluminum-based bonding pad 118 (for example, of about 1000 nm in thickness) is provided on the USG film 117. The aluminum-based bonding pad 118 and the tungsten plug 113 are provided with a titanium adhesive layer 151 (for example, of about 10 nm in thickness) as a lower layer and a titanium nitride barrier metal layer 152 (for example, of about 30 nm in thickness) as an upper layer. A titanium nitride layer 153 (for example, of about 70 nm in thickness) is formed on the bonding pad 118, and then a bonding pad opening 163 is formed in the layer 153 and the plasma SiN film 119.

Instead of the aluminum-based bonding pad 118, a copper-based bonding pad may be used.

2. Explanation of Processes Performed After Formation of Bonding Pad Opening in Manufacturing Method of Semiconductor Integrated Circuit Device in One Embodiment of Present Application (mainly see FIG. 2, FIGS. 3 to 9, FIG. 16, FIGS. 17 to 24, and FIG. 25)

Next, the formation processes of a metal layer structure (surface metal layer, gold bump, or the like) over the bonding pad in the manufacturing method of the semiconductor integrated circuit device according to the embodiment of the invention of the present application will be described below based on FIGS. 3 to 9, and FIGS. 17 to 24.

Figure 9:
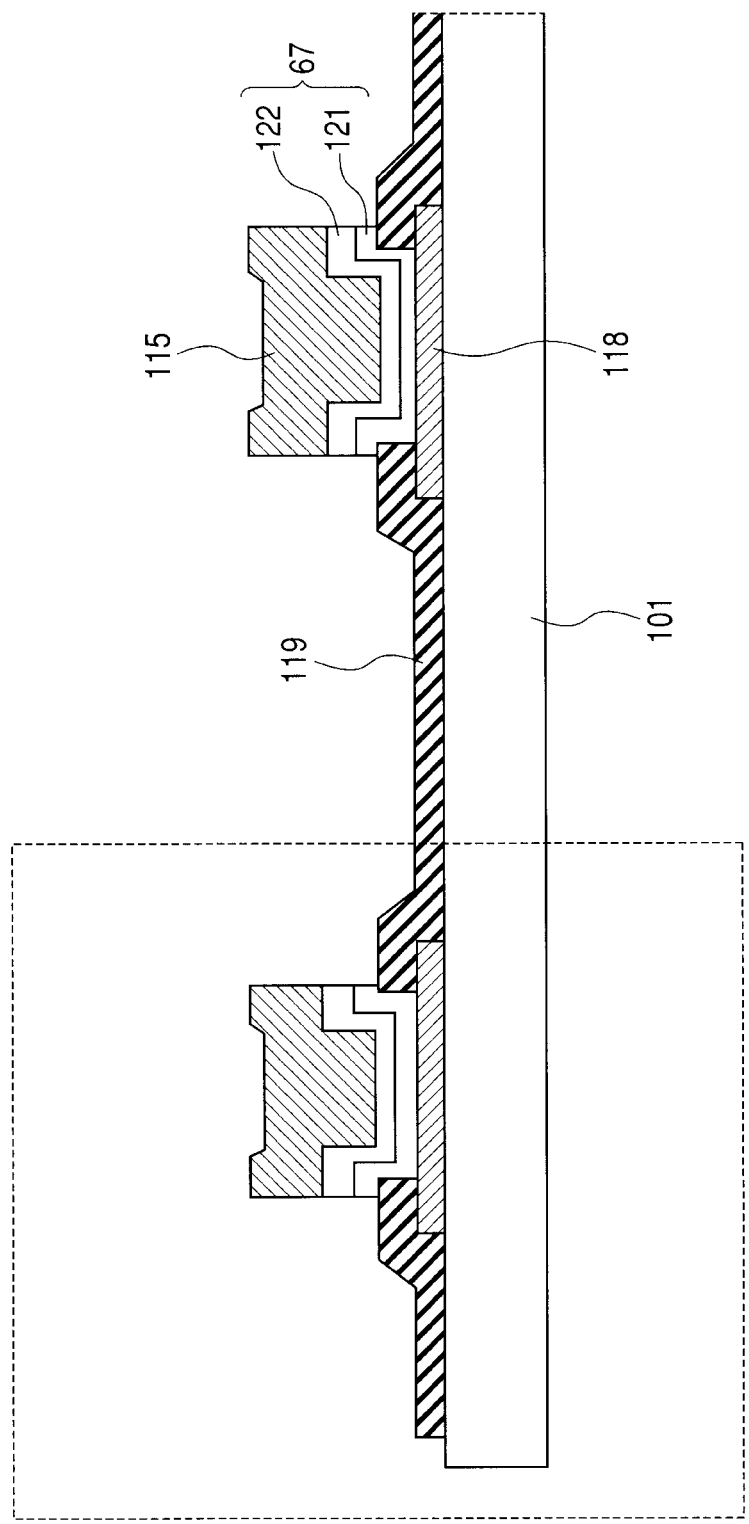
FIG. 9 is a process flowchart showing a device section (in a barrier metal removal step) of the semiconductor chip (corresponding to a section taken along the line X-X' of FIG. 24) of the semiconductor integrated circuit device in the embodiment of the present application.
Figure 16:
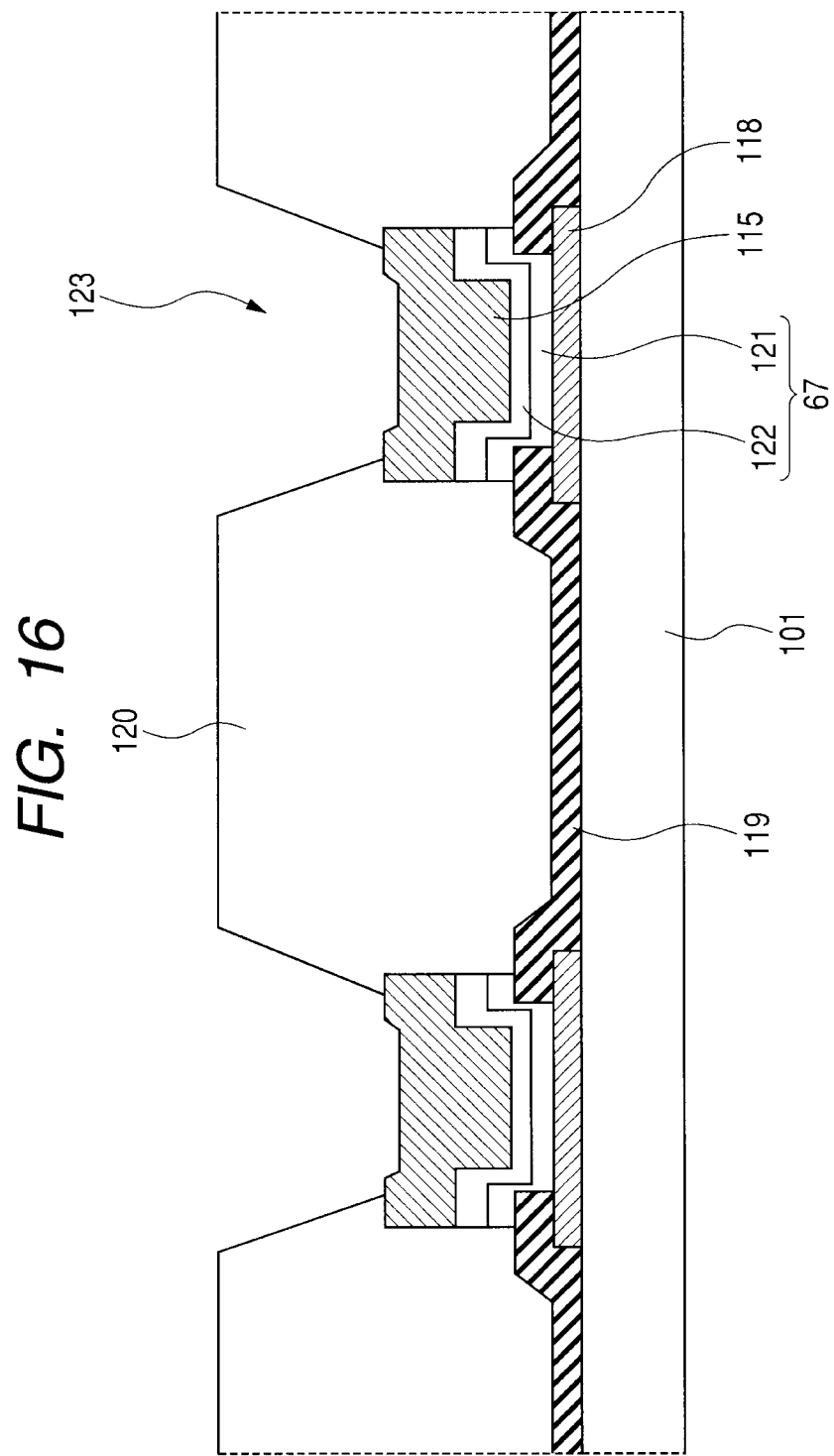
FIG. 16 is a device cross-sectional view of the semiconductor chip (at the time of completion of a wafer processing step) (corresponding to the section taken along the line X-X' of FIG. 25) of the semiconductor integrated circuit device according to another embodiment of the present application (in an example where two layered polyimide film is provided as an additional final passivation film)
Figure 17:
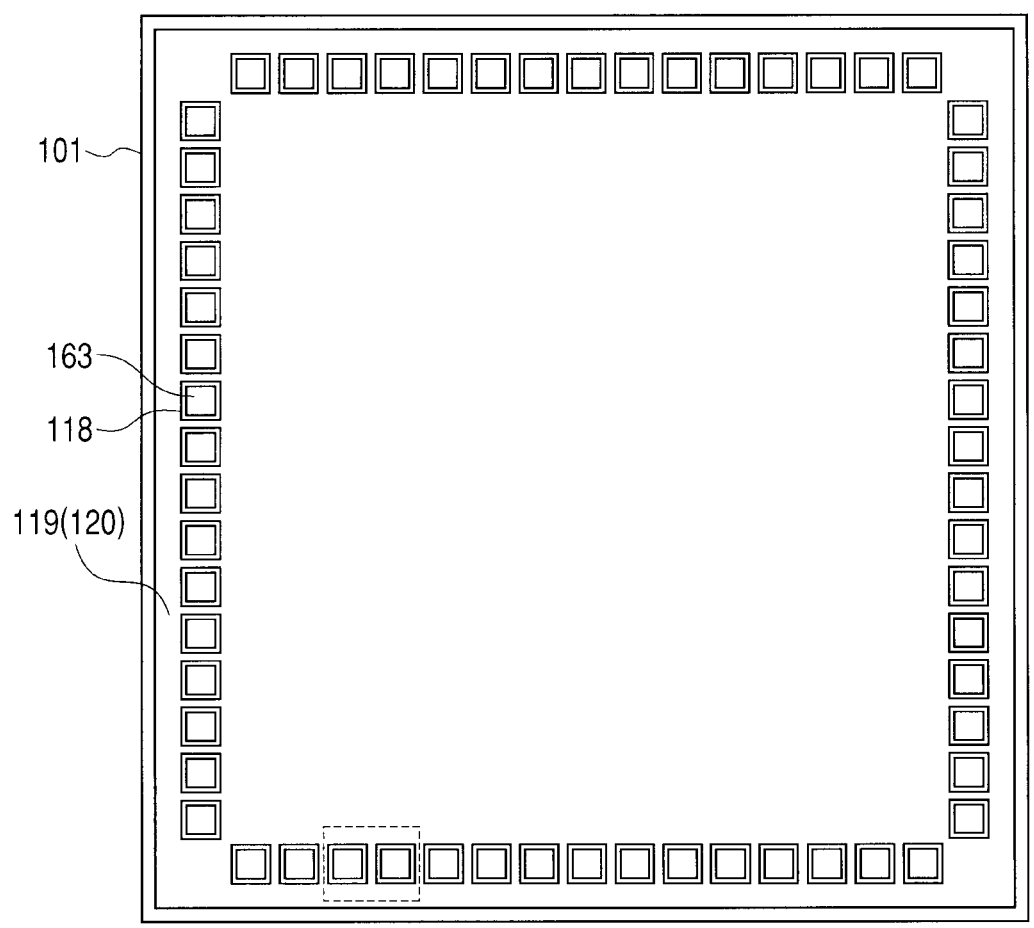
FIG. 17 is a top view of the semiconductor chip of the semiconductor integrated circuit device in the embodiment of the present application, corresponding to FIG. 3.
Figure 18:
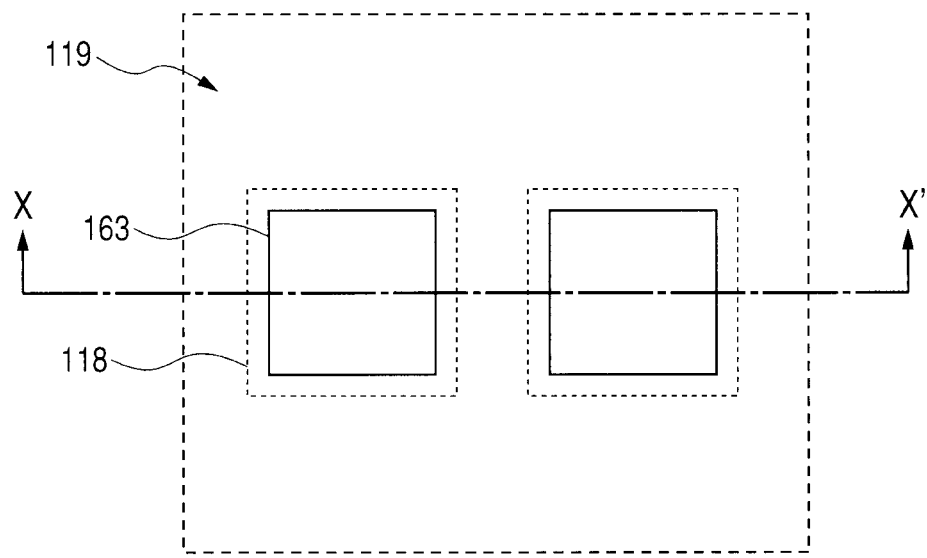
FIG. 18 is an enlarged top view (whose corresponding cross-sectional view is shown in FIG. 3) of a part enclosed by a broken line in FIG. 17.
Figure 19:
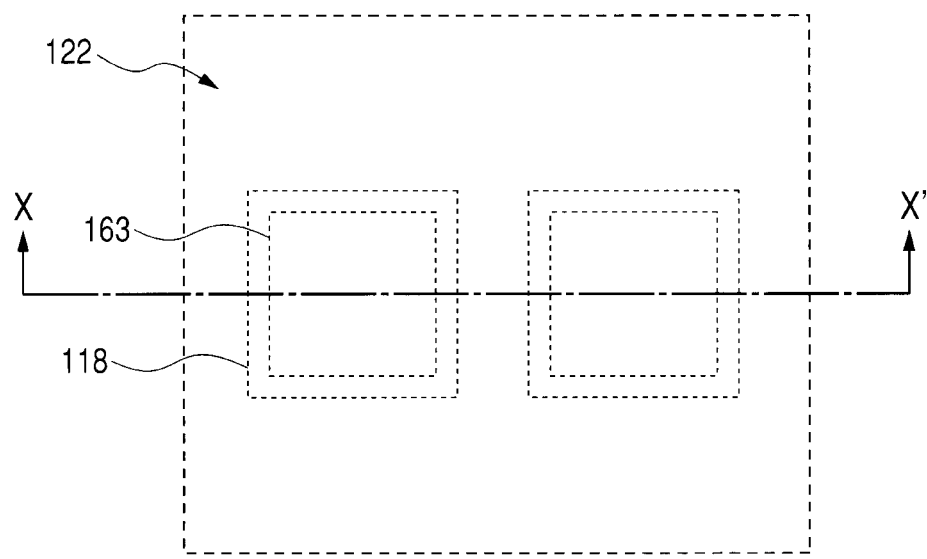
FIG. 19 is an enlarge top view of the part enclosed by the broken line in FIG. 17 in the step corresponding to FIG. 4.
Figure 20:
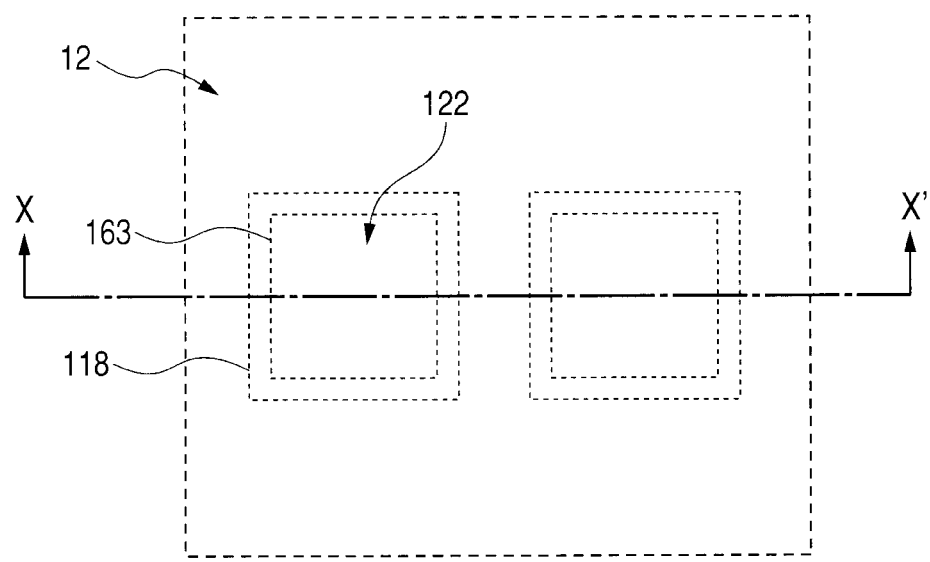
FIG. 20 is an enlarge top view of the part enclosed by the broken line in FIG. 17 in the step corresponding to FIG. 5.
Figure 21:
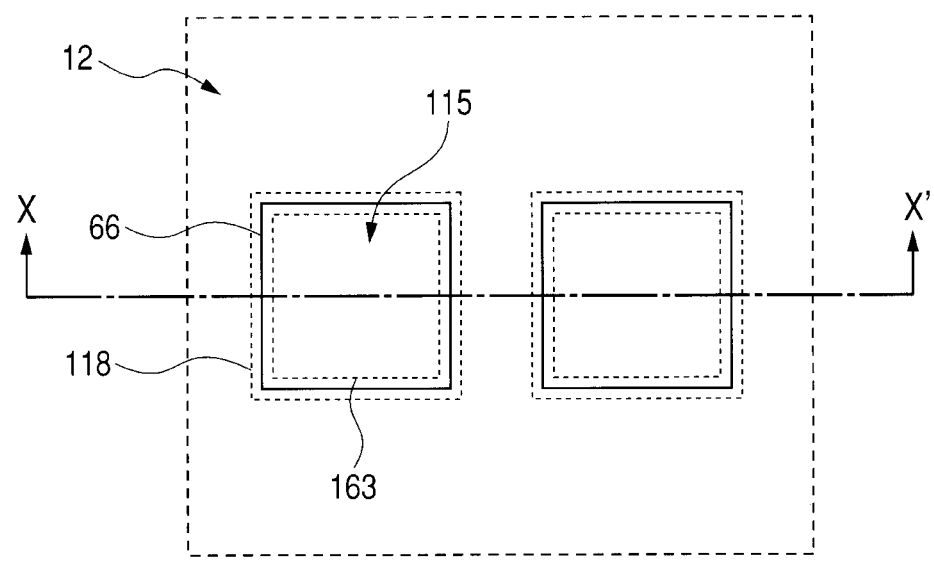
FIG. 21 is an enlarge top view of the part enclosed by the broken line in FIG. 17 in the step corresponding to FIG. 6.
Figure 22:
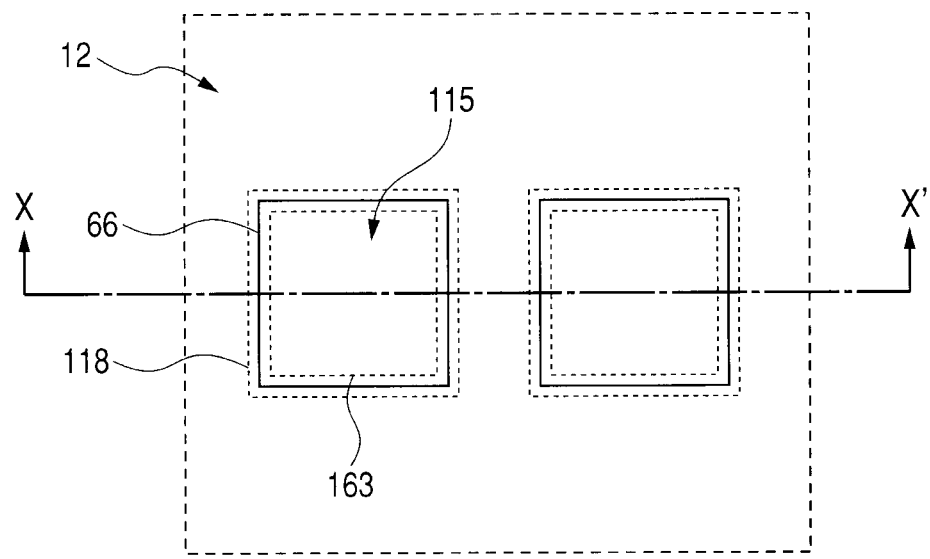
FIG. 22 is an enlarge top view of the part enclosed by the broken line in FIG. 17 in the step corresponding to FIG. 7.
Figure 23:
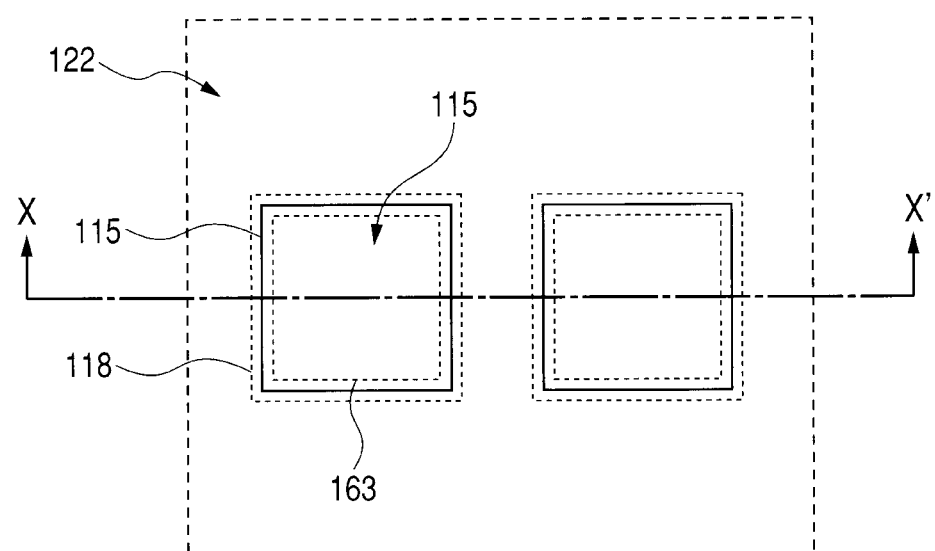
FIG. 23 is an enlarge top view of the part enclosed by the broken line in FIG. 17 in the step corresponding to FIG. 8.
Figure 24:
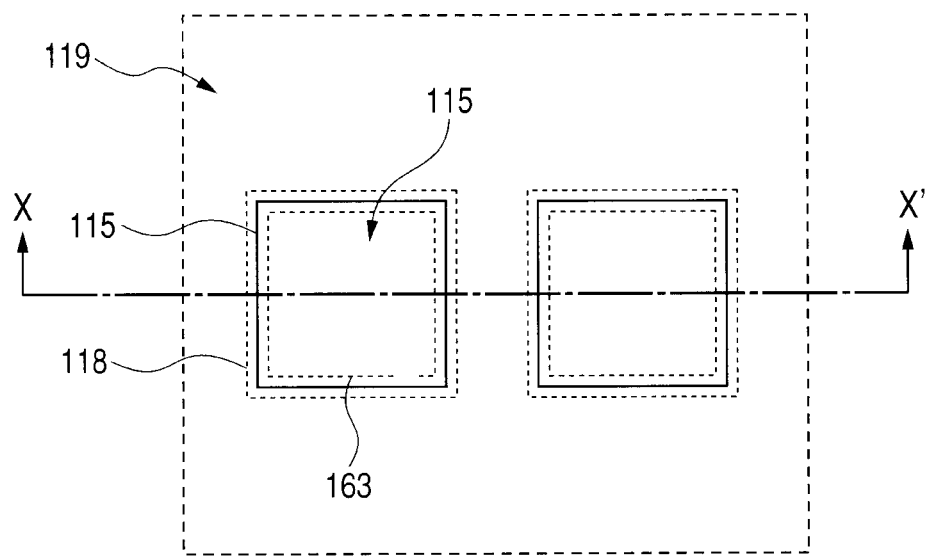
FIG. 24 is an enlarge top view of the part enclosed by the broken line in FIG. 17 in the step corresponding to FIG. 9.
Figure 25:
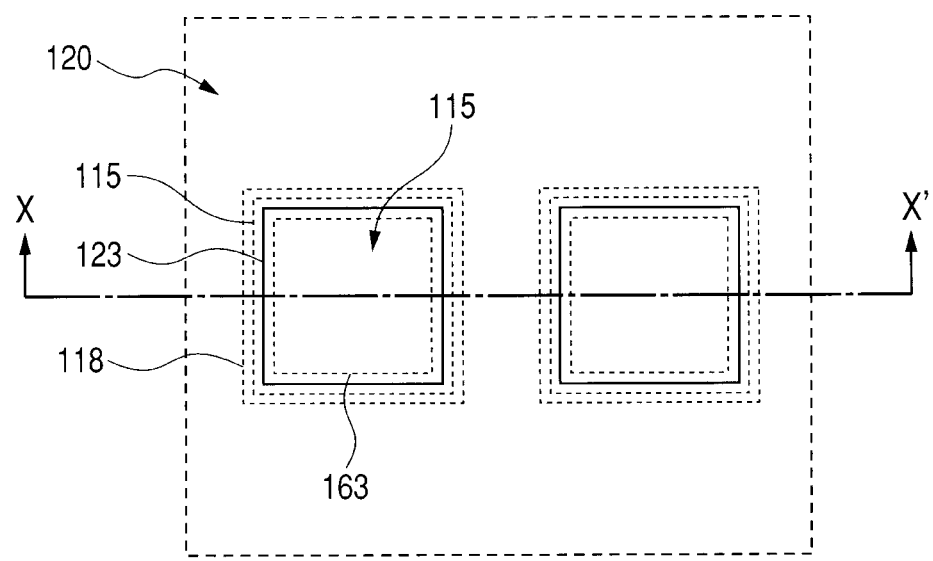
FIG. 25 is an enlarged top view of the step corresponding to FIG. 16.

FIG. 2 is a process flowchart showing the flow from the pad opening step to the wire bonding process during a manufacturing procedure of the semiconductor integrated circuit device in the embodiment of the present application. FIG. 3 is a process flowchart showing a device section (at the time of completion of the pad opening step) of a semiconductor chip (corresponding to a section taken along the line X-X' of FIG. 18) of the semiconductor integrated circuit device in the embodiment of the present application. FIG. 4 is a process flowchart showing a device section (in a barrier film formation step) of the semiconductor chip (corresponding to a section taken along the line X-X' of FIG. 19) of the semiconductor integrated circuit device in the embodiment of the present application. FIG. 5 is a process flowchart showing a device section (in a resist film application step) of the semiconductor chip (corresponding to a section taken along the line X-X of FIG. 20) of the semiconductor integrated circuit device in the embodiment of the present application. FIG. 6 is a process flowchart showing a device section (in a resist film opening step) of the semiconductor chip (corresponding to a section taken along the line X-X' of FIG. 21) of the semiconductor integrated circuit device in the embodiment of the present application. FIG. 7 is a process flowchart showing a device section (in a gold plating step) of the semiconductor chip (corresponding to a section taken along the line X-X' of FIG. 22) of the semiconductor integrated circuit device in the embodiment of the present application. FIG. 8 is a process flowchart showing a device section (in a resist removal step) of the semiconductor chip (corresponding to a section taken along the line X-X' of FIG. 23) of the semiconductor integrated circuit device in the embodiment of the present application. FIG. 9 is a process flowchart showing a device section (in a barrier metal removal step) of the semiconductor chip (corresponding to a section taken along the line X-X' of FIG. 24) of the semiconductor integrated circuit device in the embodiment of the present application. FIG. 16 is a device cross-sectional view of the semiconductor chip (at the time of completion of a wafer processing step) (corresponding to the section taken along the line X-X' of FIG. 25) of the semiconductor integrated circuit device according to another embodiment of the present application (in an example where two layered polyimide film is provided as an additional final passivation film). FIG. 17 is a top view of the semiconductor chip of the semiconductor integrated circuit device in the embodiment of the present application, corresponding to FIG. 3. FIG. 18 is an enlarged top view (whose corresponding cross-sectional view is shown in FIG. 3) of a part enclosed by a broken line in FIG. 17. FIG. 19 is an enlarged top view of the part enclosed by the broken line in FIG. 17 in the step corresponding to FIG. 4. FIG. 20 is an enlarged top view of the part enclosed by the broken line in FIG. 17 in the step corresponding to FIG. 5. FIG. 21 is an enlarged top view of the part enclosed by the broken line in FIG. 17 in the step corresponding to FIG. 6. FIG. 22 is an enlarged top view of the part enclosed by the broken line in FIG. 17 in the step corresponding to FIG. 7. FIG. 23 is an enlarged top view of the part enclosed by the broken line in FIG. 17 in the step corresponding to FIG. 8. FIG. 24 is an enlarged top view of the part enclosed by the broken line in FIG. 17 in the step corresponding to FIG. 9. FIG. 25 is an enlarged top view of the step corresponding to FIG. 16.

First, as shown in FIGS. 3, 17, and 18, a final passivation film 119 made of, for example, silicon nitride or the like (which is not limited to an inorganic film, but may be an organic film) is formed on a main surface of a wafer 101 including a number of devices and wirings (made of a silicon oxide, or various metal layers) formed therein under the pad (note that a polyimide resin layer 120 is often formed thereon as shown in FIG. 16). The pad opening 163 (which is an opening formed in the final passivation film 119) is provided in a position corresponding to the aluminum pad 118 (in the pad opening step S201 shown in FIG. 2).

Then, sputtering etching is performed in an atmosphere containing argon as a principal component so as to remove a natural oxide film on the surface of the bonding pad 118 in the state shown in FIG. 3 (in a sputtering etching process at step S202 shown in FIG. 2).

Then, as shown in FIGS. 4 and 19, a barrier and seed metal layer (under bump metal film) 67 is formed by sputtering deposition. A barrier metal film 121 as a lower layer can be, for example, a titanium film having a thickness of, for example, about 175 μm (whose thickness can be preferably in a range of 150 to 200 μm) (in a Ti sputtering process at step S203 shown in FIG. 2). A seed metal film 122 as an upper layer can be, for example, a palladium film having a thickness of, for example, about 175 μm (whose thickness can be preferably in a range of about 150 to 200 μm) (in a Pd sputtering process at step S204 shown in FIG. 2).

Then, as shown in FIGS. 5 and 20, a positive type resist film 12 (or a negative type one if necessary) having, for example, a thickness of 4 μm (whose thickness can be preferably in a range of about 2 to 6 μm) is formed on the film 122 (in a resist application process at step S205 shown in FIG. 2).

Then, as shown in FIGS. 6 and 21, the resist is exposed (for example, exposed to i-rays), and developed (for example, by alkaline developer) to form openings 66 (in an exposure process at step S206 and a development process at step S207 as shown in FIG. 2). Subsequently, an oxygen asher process (oxygen plasma process) is performed (for example, at room temperature for about 120 seconds) so as to remove organic contaminants or the like at the bottom of the opening 66 (in an $O_2$ ashing process at step S208 shown in FIG. 2).

Then, as shown in FIGS. 7 and 22, a gold layer serving as a surface metal layer (bump electrode) 115 of, for example, about 2 μm in thickness (whose thickness is preferably in a range of 1 to 5 μm) is embedded in the opening 66 by electroplating (in an electrolytic plating process at step S209 shown in FIG. 2). Conditions for plating can be, for example, that as to a wafer of 300 φ), a sodium gold sulfite plating solution is used at a temperature of the solution of 55 degrees C. and a current value of 0.1 to 1 A/dm$^2$ for a plating time of about 20 minutes.

Thereafter, as shown in FIGS. 8 and 23, the resist film 12 is removed (in a resist removal process at step S210 shown in FIG. 2). Subsequently, the oxygen asher process (oxygen plasma process) is performed (for example, at room temperature for about 120 seconds) in order to remove organic contaminants or the like (in an $O_2$ ashing process at step S211 shown in FIG. 2). Finally, as shown in FIGS. 9 and 24, unnecessary parts of the barrier and seed metal layer 67 (UBM film) are selectively removed in turn by wet etching using the surface metal layer (gold bump electrodes) 115 as a mask (in a Pd wet etching process at step S212 and in a Ti wet etching process at step S213 shown in FIG. 2). An etching solution for the seed metal film 122 can be, for example, an iodic etching solution, and an etching solution for the barrier film 121 can be, for example, a mixture of ammonia and hydrogen peroxide, or the like. Subsequently, the oxygen asher process (oxygen plasma process) is performed (for example, at room temperature for about 120 seconds) in order to remove organic contaminants or the like (in an $O_2$ ashing process at step S214 shown in FIG. 2).

At this time, the surface metal layer (bump electrode) is finished. The surface metal layer (gold bump electrode) 115 is normally comprised of relatively pure gold material. However, the surface metal layer can be basically comprised of a gold-based alloy containing gold as a principal component. In Section 3, the following steps and the like for the part enclosed by a broken line in FIG. 9 will be described later.

The barrier metal film can include one selected from the group consisting of titanium, chromium, titanium nitride, and tungsten nitride as a principal component. The barrier metal film is required to have the capability of sputtering deposition, and adequate barrier property against gold.

Further, the seed metal film can be comprised of one selected from the group comprising copper, gold, nickel, platinum, rhodium, molybdenum, tungsten, chromium, and tantalum as a principal component. The seed metal film is required not to react with the barrier metal film, not to form a fragile reaction layer by reaction with gold, and to be such a low-resistance material that allows an electrolytic gold layer to grow.

FIG. 16 is a modified example corresponding to the structure described with reference to FIGS. 3 to 9, and the like. In an example shown in FIGS. 16 and 25, after patterning the plasma SiN film (inorganic final passivation film on the pad) 119, the polyimide film 120 which is an organic passivation film is formed thereon, and then patterned (to form an opening 123 in the polyimide film). This example is subjected to the complicated processes and thus has the complicated structure, but has an advantage in improvement of reliability. Instead of, or in addition to this structure, the inorganic final passivation film 119 can be comprised of an inorganic insulating film as a lower layer and a polyimide film as an upper layer.

3. Explanation of Assembly Processes and Device Structure in Manufacturing Method of Semiconductor Integrated Circuit Device in One Embodiment of Present Application (see FIGS. 10 to 12, in addition to FIGS. 2 and 9, and the like)

In this section, the procedure following the processes described in Section 2 from the $O_2$ ashing process at step S214 to the wire bonding process at step S219 (formation of a stud bump in use thereof) shown in FIG. 2 will be described below.

Figure 10:
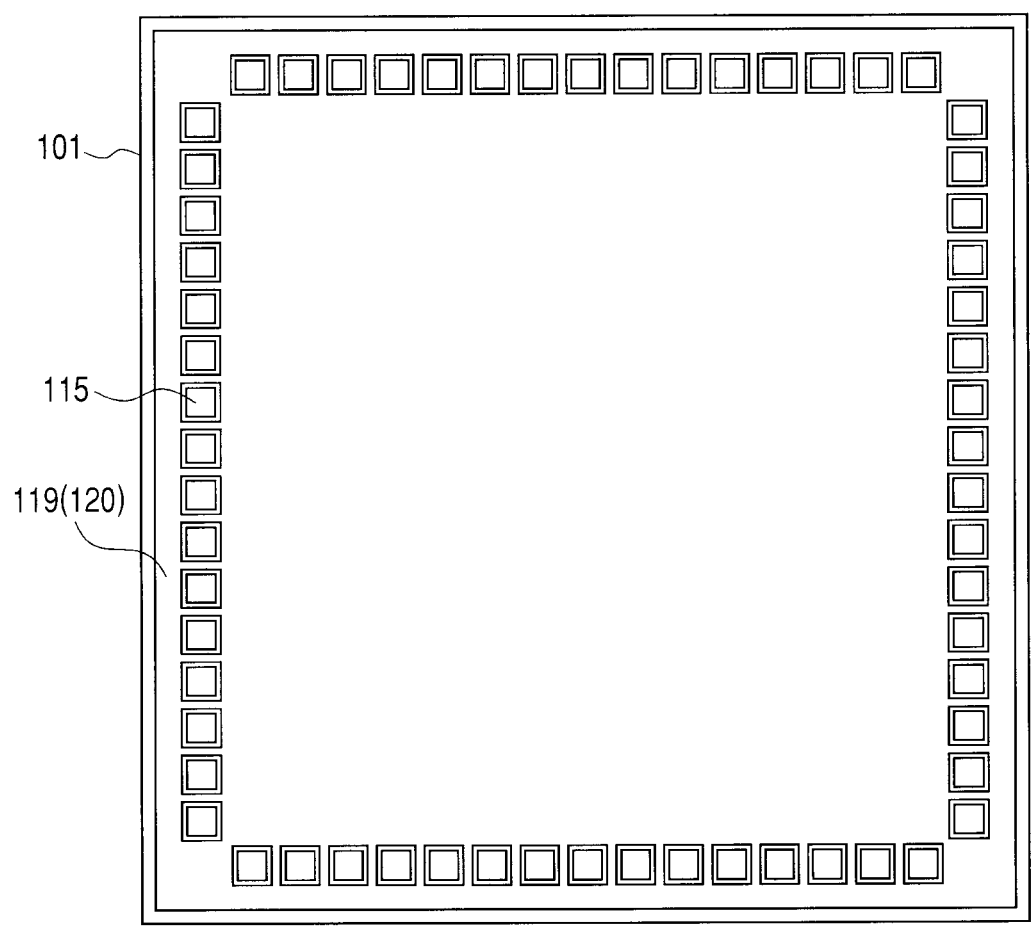
FIG. 10 is a top view of the semiconductor chip of the semiconductor integrated circuit device in the embodiment of the present application, corresponding to FIG. 9.
Figure 11:
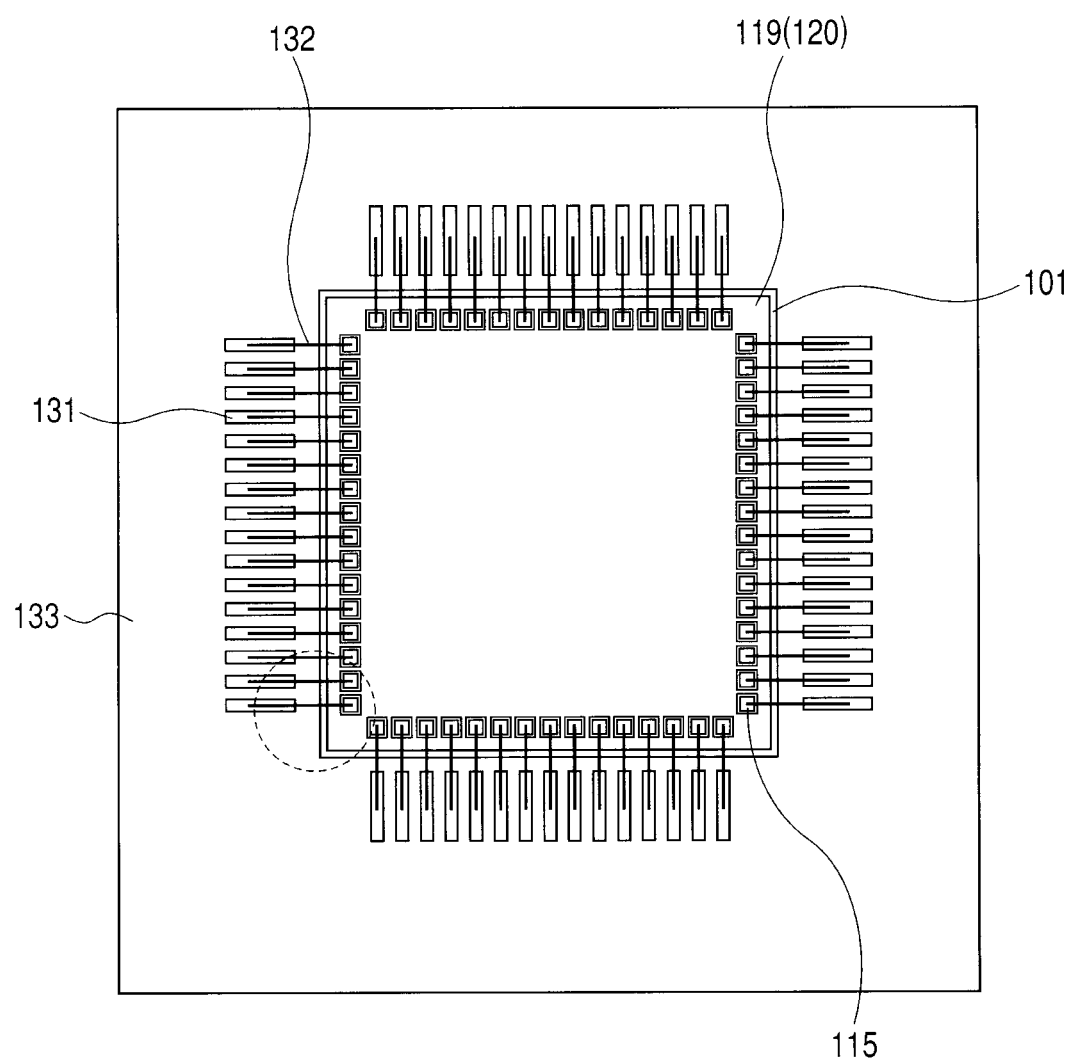
FIG. 11 is a top view of the semiconductor integrated circuit device in the embodiment of the present application.
Figure 12:
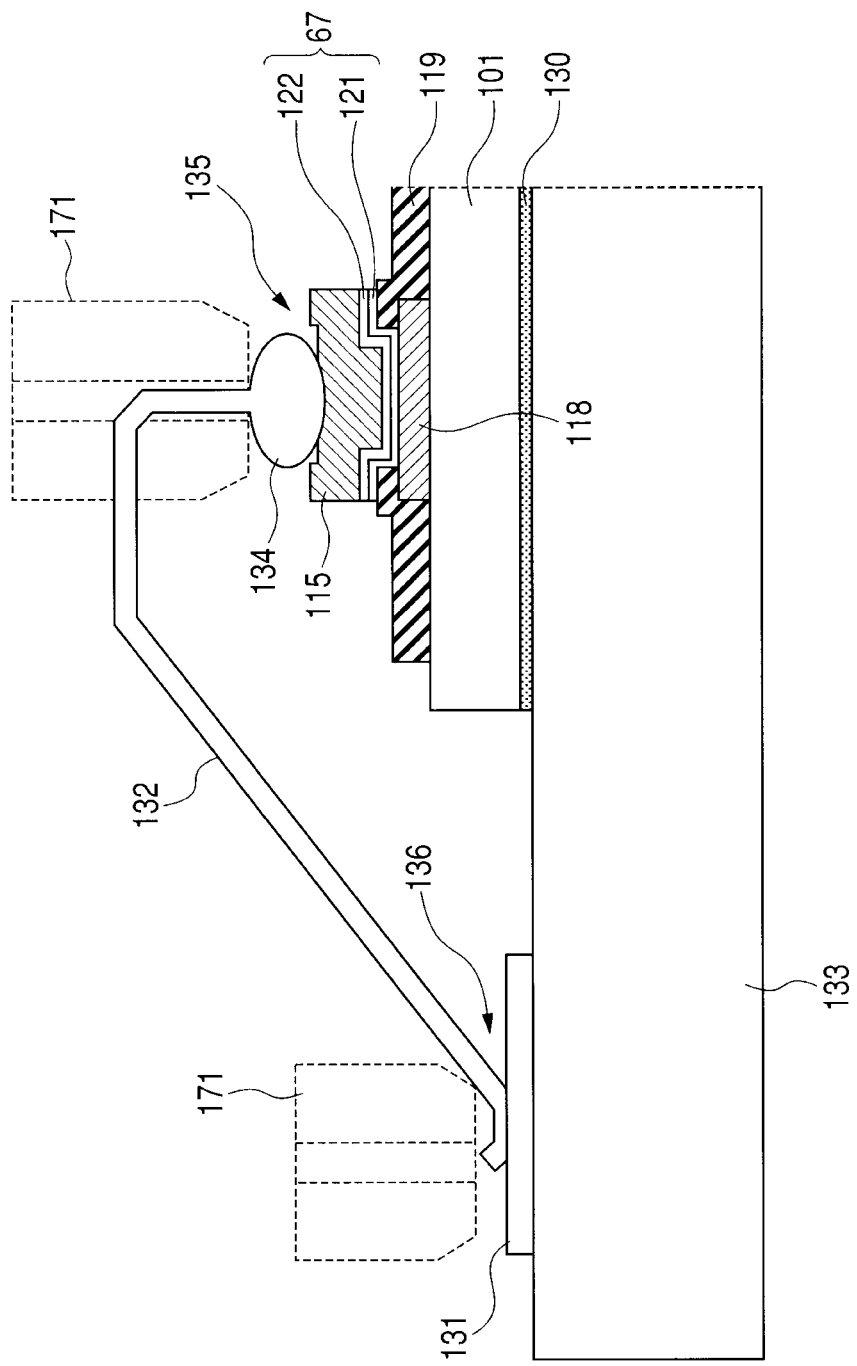
FIG. 12 is an exemplary cross-sectional view corresponding to a part enclosed by a broken line shown in FIG. 11.

FIG. 10 is a top view of the semiconductor chip of the semiconductor integrated circuit device in the embodiment of the present application, corresponding to FIG. 9. FIG. 11 is a top view of the semiconductor integrated circuit device in the embodiment of the present application. FIG. 12 is an exemplary cross-sectional view corresponding to a part enclosed by a broken line of FIG. 11.

As shown in FIG. 2, after the $O_2$ ashing process in step S214 (see FIG. 2) described with reference to FIG. 9 (FIG. 16), a probe test 215 (wafer inspection) is performed on the wafer 101. Thereafter, the back side of the wafer 101 is grounded into a predetermined thickness, that is, subjected to back grinding in a BG process at step S216. Subsequently, a dicing process is performed which involves dividing the wafer 101 into chips 101 using a laser, a rotation blade, or both thereof in step S217. The state of the chips 101 divided is shown below.

FIG. 10 is a top entire view of the semiconductor chip 101 of the semiconductor integrated circuit device in the embodiment of the present application, corresponding to FIG. 9 (or FIG. 16). In the figure, the semiconductor chip 101 has substantially the entire surface thereof covered with the final passivation film 119 (120), and the surface metal layer 115 is provided on each pad of the periphery of the film.

Then, as shown in FIGS. 11 and 12 (enlarged cross-sectional view of the part enclosed by the broken line of FIG. 11), the semiconductor chip 101 is die-bonded over a wiring board 133 (which may be a ceramic substrate, a flexible wiring board, or the like), which is an organic multilayer wiring board or the like (may be a single layer wiring board), via the adhesive layer 130 (die attach film, paste, or the like) (in a die bonding process at step S218 shown in FIG. 2).

Then, as shown in FIG. 12, the use of a bonding wire 132 and a bonding capillary 171 including gold as a principal component couples the surface metal layer 115 (metal surface) over the bonding pad 118 on the chip (die) 101 to a lead portion 131 outside the chip 101 (in this case, on the wiring board 133) (in the wire bonding process at step S219 at a bonding temperature of, for example, about 150 degrees as shown in FIG. 2). In this case, the surface metal layer 115 side is subjected to ball bonding (at a primary ball bonding portion 135) together with a ball 134, and the lead portion 131 side is subjected to wedge bonding (at a secondary bonding portion 136) (note that both portions are regarded as one set and referred to as "ball bonding", "ball wedge bonding", "nailhead bonding", or the like). The type of bonding is preferably a thermo-sonic bonding process (using a combination of heating and ultrasonic energy) from the requirement of reduction in temperature. Bonding using the ball 134 on the chip side in this way (the way in which the chip side serves as the secondary bonding portion) is especially referred to as "forward bonding" so as to be distinguished from "reverse bonding" shown in FIG. 14 as described in the following section.

In this embodiment, a surface metal layer including gold as a principal component is formed over the aluminum based (or copper based) bonding pad on the semiconductor chip side, whose properties are not uncertain, via an intermediate metal layer comprised of barrier metal and the like. Even when the gold-based bonding wire including gold as a principal component (for example, which may contain palladium and other additives) is used for interconnection with the wiring board and the like, the progress of an undesired reaction due to the use at high temperature for a long time can be avoided.

The surface of the lead portion 131 is desirable as a so-called bonding metal film (metal film including gold, silver, palladium, or an alloy thereof as a principal component) from the viewpoint of the reliability.

4. Explanation of Modified Example of Assembly Process and Device Structure in Manufacturing Method of Semiconductor Integrated Circuit Device in One Embodiment of Present Application (see FIGS. 13 to 15)

Various modified examples regarding the assembly process and assembly structure described in Section 3 will be described below.

Figure 13:
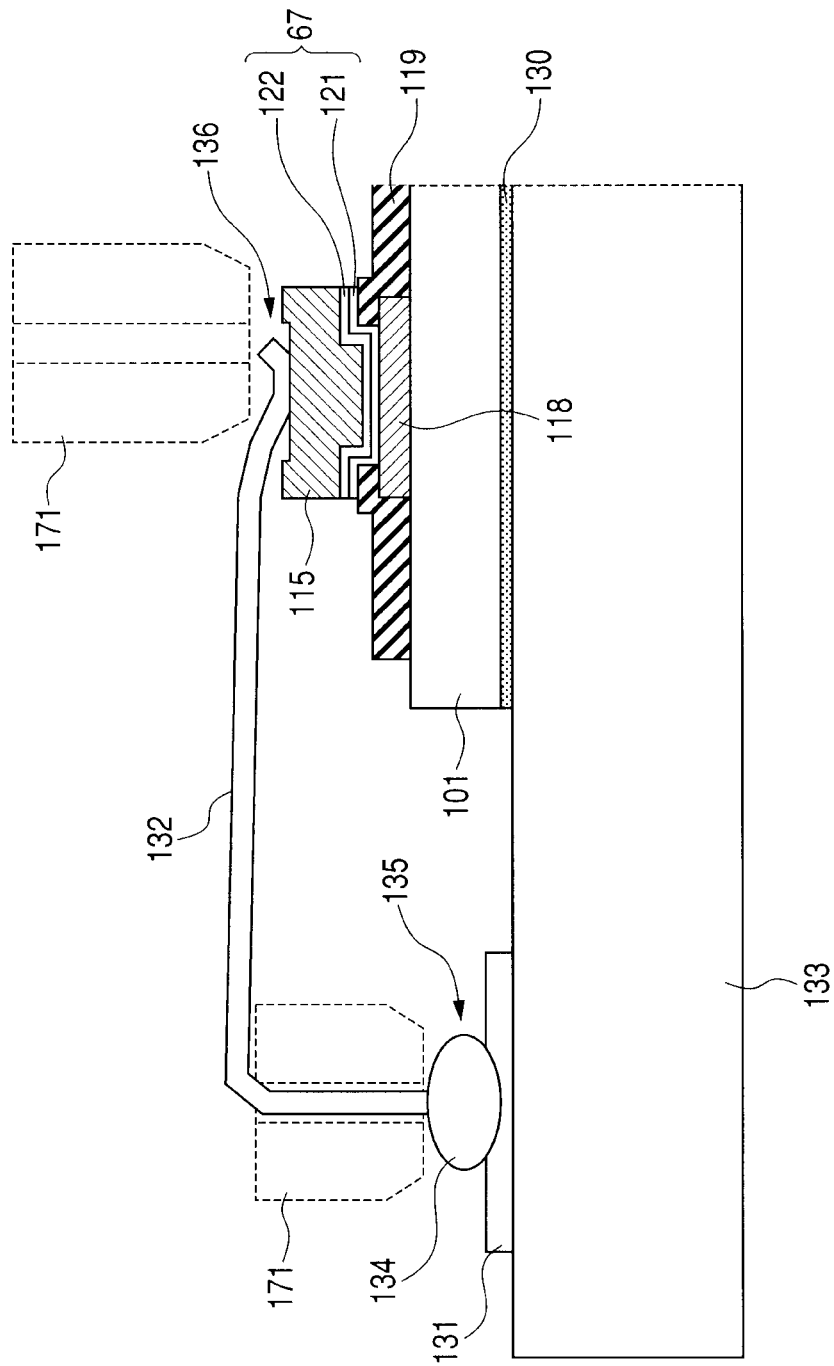
FIG. 13 is an exemplary cross-sectional view showing an example in which the order of wire bonding is changed from that in FIG. 12.
Figure 14:
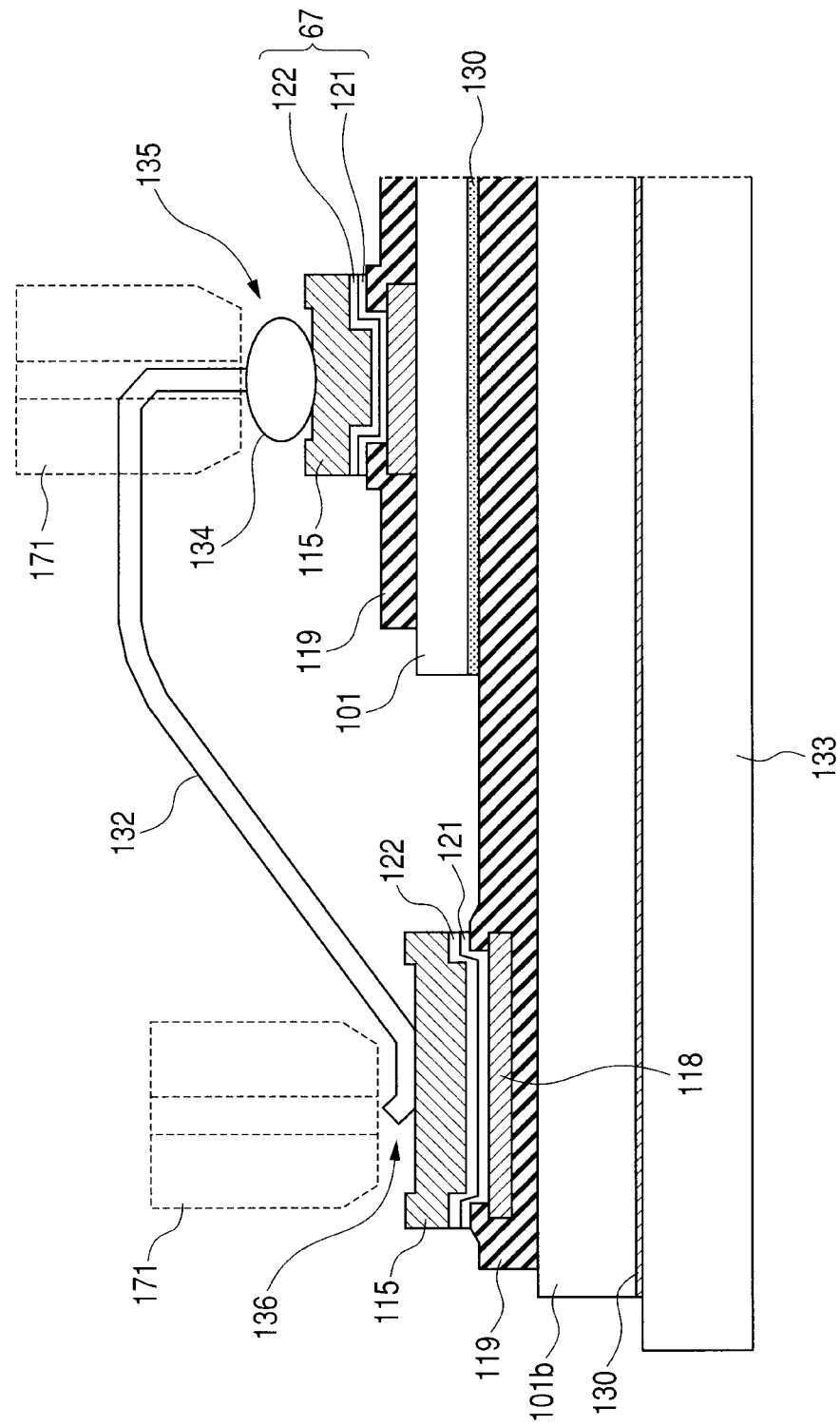
FIG. 14 is an exemplary cross-sectional view showing an example in which a wiring board is replaced by other electronic elements on the wiring board in FIG. 12.
Figure 15:
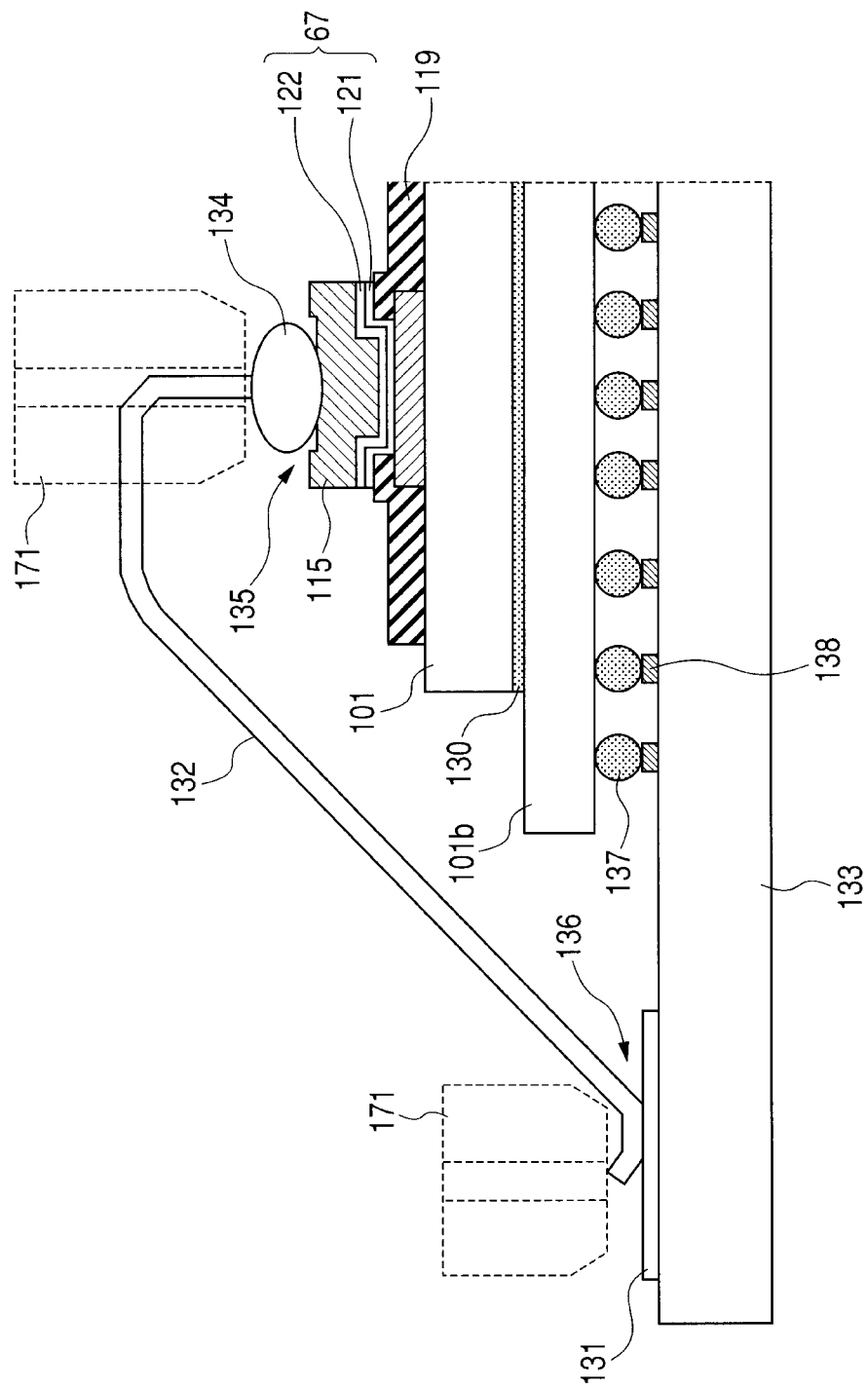
FIG. 15 is an exemplary cross-sectional view showing an example in which a target part of the semiconductor chip to be die-bonded is replaced by another electronic element (flip-chip bonded) on the wiring board in FIG. 12.

FIG. 13 is an exemplary cross-sectional view showing an example in which the order of wire bonding is changed from that in FIG. 12. FIG. 14 is an exemplary cross-sectional view showing an example in which the wiring board is replaced by another electronic element on the wiring board in FIG. 12. FIG. 15 is an exemplary cross-sectional view showing an example in which a target part of the semiconductor chip to be die-bonded is replaced by a further electronic elements (flip-chip bonded) onto the wiring board in FIG. 12.

(1) Explanation of Reverse Bonding System (Backward Bonding) (See FIG. 13)

As shown in FIG. 13, the order of the wire bonding shown in FIG. 12 may be reversed. That is, the reverse bonding may be employed. In this case, the surface metal layer 115 side is the secondary bonding portion 136, which has a merit of reduction in height of a wire loop. The normal direct bonding to the aluminum bonding pad 118 has problems of impact on the device. However, in this example, the presence of the relatively thick surface metal layer 115 relatively reduces the influences on the above problems.

Like Section 3, the surface of the lead portion 131 is desired to have the so-called bonding metal film (metal film including gold, silver, palladium, or an alloy thereof as a principal component) from the viewpoint of reliability.

(2) Explanation of Wire Bonding System Between Two Chips (See FIG. 14)

In this example as shown in FIG. 14, unlike FIGS. 12 and 13, the semiconductor chip 101 is die-bonded not directly on a wiring board 133, but over another semiconductor chip 101b (more widely, a device chip) on the wiring board 133, that is, an underlayer chip (underlayer electronic element, hereinafter referred to as the same). In the case where the surface metal layer 115 on the semiconductor chip 101 is interconnected to the surface metal layer 115 on the underlayer chip 101b via the bonding wire 132, when another semiconductor chip 101b has the same multilayer metal structure on the pad as that of the semiconductor chip 101, both bonding portions have the structures with high reliability.

The reverse bonding can also be applied.

(3) Explanation of Flip Chip Die Bonding Type (See FIG. 15)

As shown in FIG. 15, the die bonding of the semiconductor chip 101 may be performed over another semiconductor chip 101b which is flip-chip bonded to the wiring board 133 (bonded to land electrodes 138 for solder bump on the wiring substrate 133 by solder bumps 137), that is, over an underlayer chip. In this case, the interconnection by the bonding wire 132 is performed at the surface metal layer 115 over the semiconductor chip 101, an electrode (lead portion) on the device chip other than the underlayer chip 101b, or the lead portion 131 on the wiring board 133.

Like the description in Section 3, the surface of the lead portion 131 is desired to be the so-called bonding metal film (metal film including gold, silver, palladium, or an alloy thereof as a principal component) from the viewpoint of the reliability.

The reverse bonding can also be applied.

5. Explanation of Various Package Forms of Semiconductor Integrated Circuit Device in One Embodiment of Present Application (Mainly See FIGS. 38 to 44)

In this section, various package forms of the semiconductor integrated circuit device in one embodiment of the present application (note that the same goes for other embodiments) will be described below.

Figure 38:
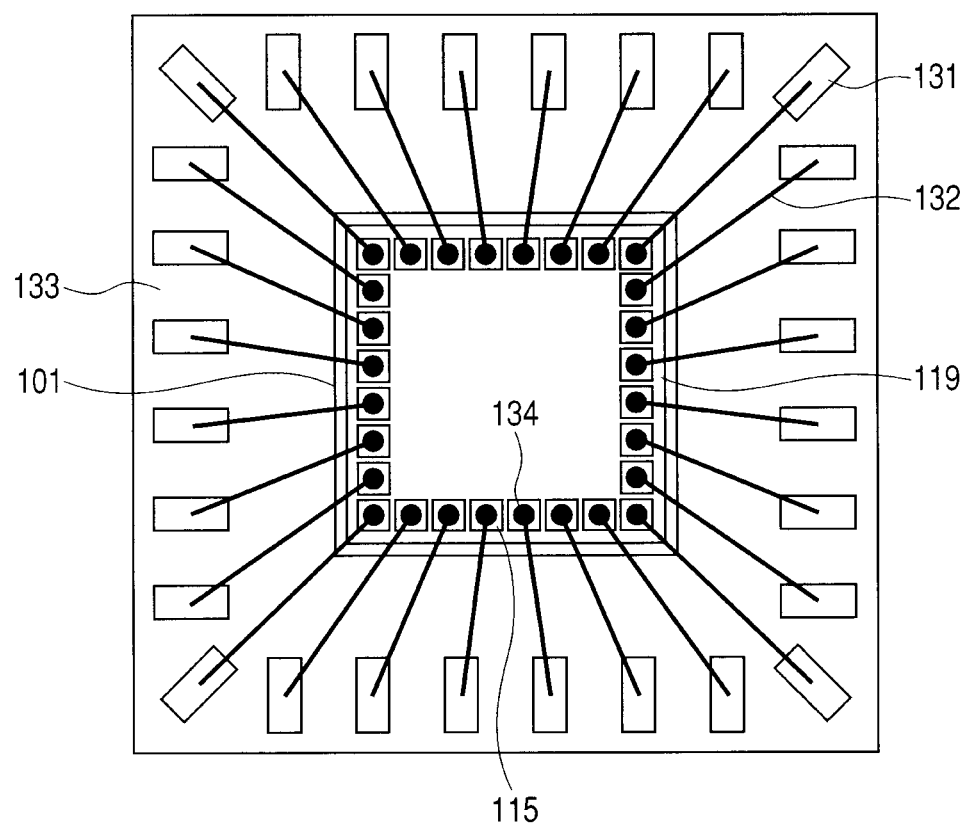
FIG. 38 is an entire top view of the semiconductor integrated circuit device (wire bonding type BGA) at the time of completion of a packaging process in the embodiment of the present application (omitting illustration of a resin sealing member for easy understanding)
Figure 39:
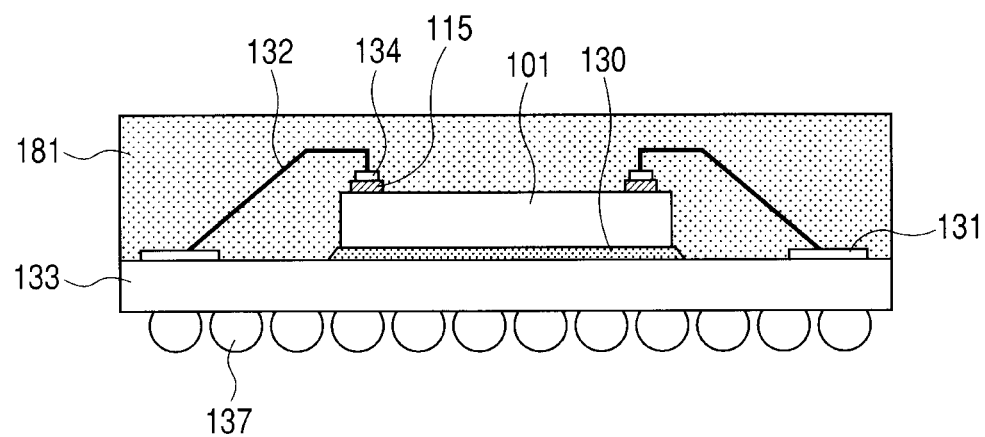
FIG. 39 is an exemplary cross-sectional view of FIG. 38.
Figure 40:
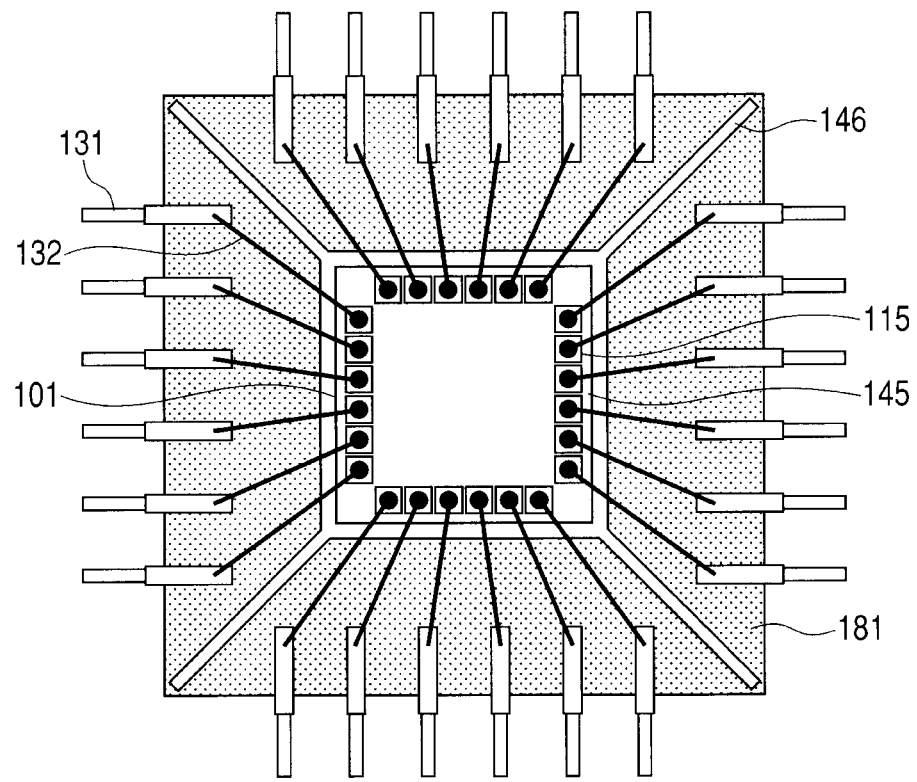
FIG. 40 is an entire top view of the semiconductor integrated circuit device (QFP: Quad Flat Package) at the time of completion of a packaging process in the embodiment of the present application (omitting illustration of an upper half part of the resin sealing member for easy understanding)
Figure 41:
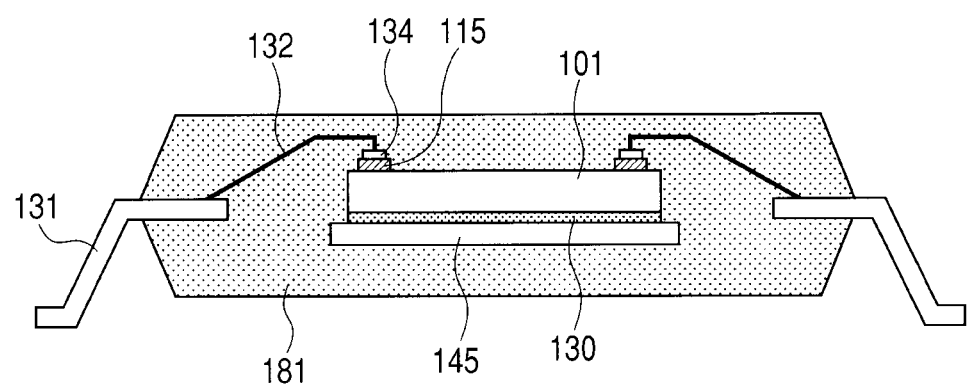
FIG. 41 is an exemplary cross-sectional view of FIG. 40.
Figure 42:
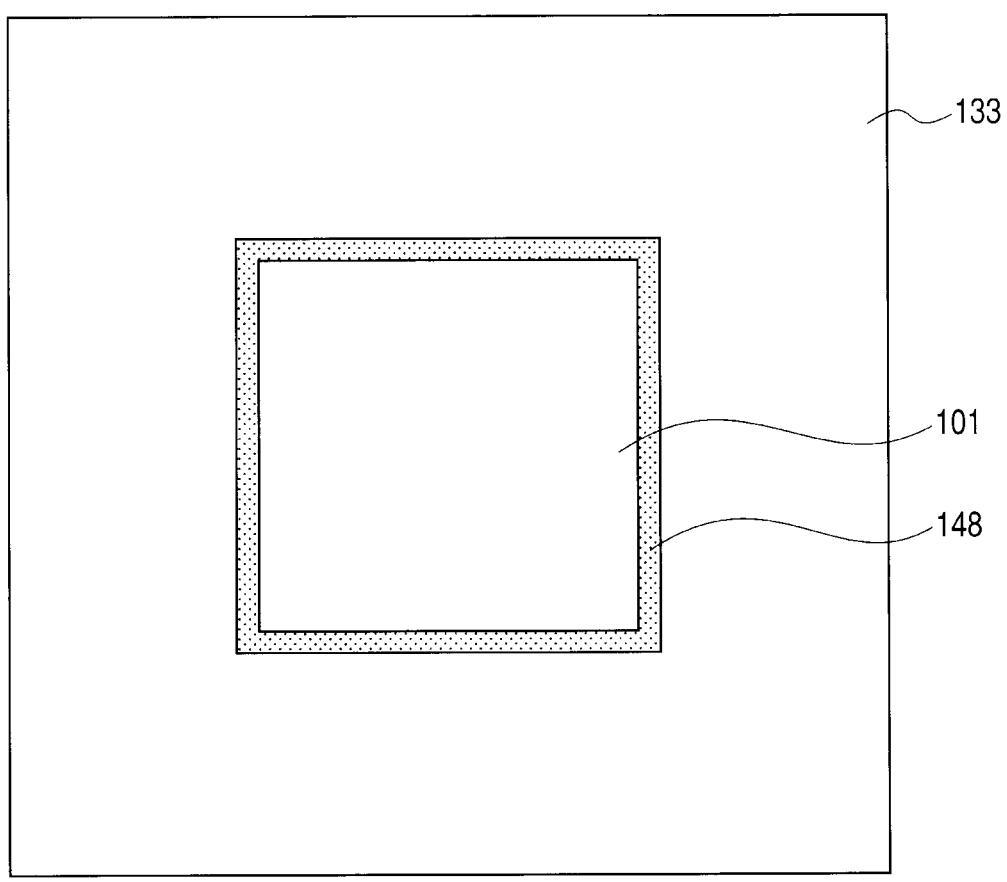
FIG. 42 is an entire top view of the semiconductor integrated circuit device (flip-chip type BGA) at the time of completion of a packaging process in the embodiment of the present application.
Figure 43:
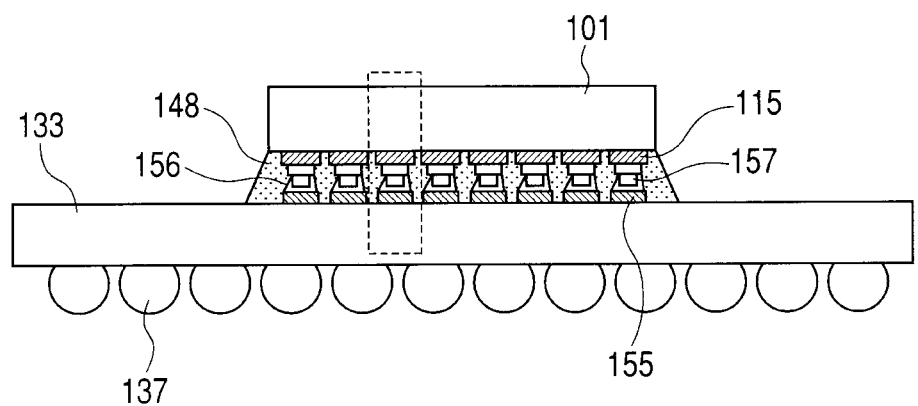
FIG. 43 is an exemplary cross-sectional view of FIG. 42.
Figure 44:
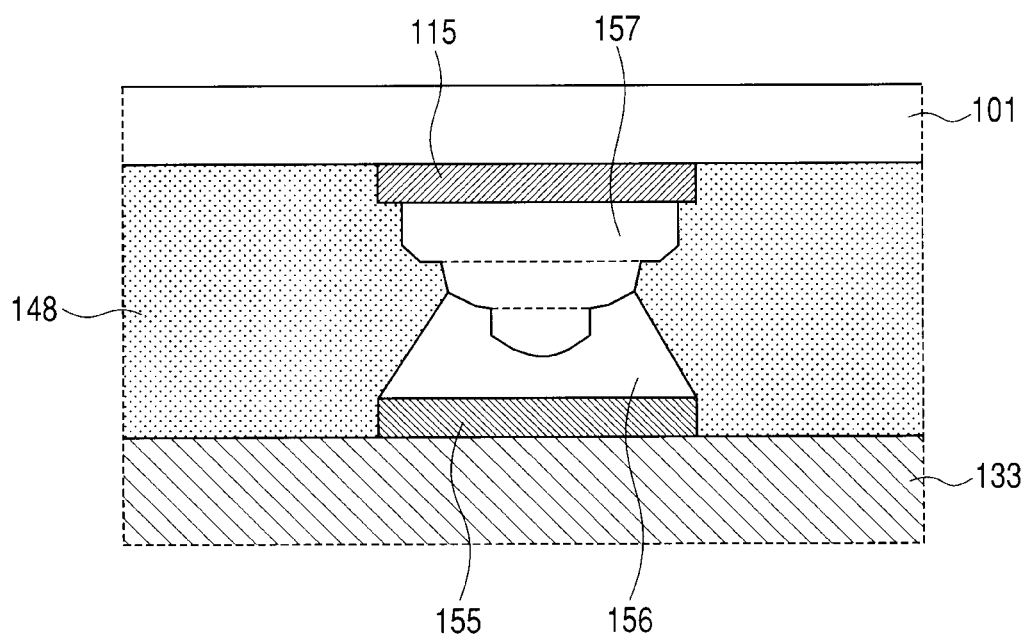
FIG. 44 is an enlarged cross-sectional view of a part enclosed by a broken line in FIG. 43.

FIG. 38 is an entire top view of the semiconductor integrated circuit device (wire bonding type BGA) at the time of completion of a packaging process in the embodiment of the present application (omitting illustration of a resin sealing member for easy understanding). FIG. 39 is an exemplary cross-sectional view of FIG. 38. FIG. 40 is an entire top view of the semiconductor integrated circuit device (QFP: Quad Flat Package) at the time of completion of a packaging process in the embodiment of the present application (omitting illustration of an upper half part of the resin sealing member for easy understanding). FIG. 41 is an exemplary cross-sectional view of FIG. 40. FIG. 42 is an entire top view of the semiconductor integrated circuit device (flip-chip type BGA) at the time of completion of a packaging process in the embodiment of the present application. FIG. 43 is an exemplary cross-sectional view of FIG. 42. FIG. 44 is an enlarged cross-sectional view of the part enclosed by a broken line of FIG. 43.

First, based on FIGS. 38 and 39, the wire bonding type BGA using the wiring board 133 (for example, organic multilayer wiring board) will be described below. As shown in FIGS. 38 and 39, the device chip 101 (semiconductor chip) is die-bonded over the wiring board 133 via an adhesive layer 130 (for example, a die attach film or a die bond paste, or the like). A plurality of surface metal layers 115 (on the bonding pad) are provided over the upper surface of the device chip 101, and are coupled to a plurality of outer leads 131 provided on the upper surface of the wiring board 133 via the bonding wires 132. In this example, bonding balls 134 are made on the surface metal layer 115 side. The upper surface of the wiring board 133 is sealed with a sealing resin 181. In contrast, a plurality of solder bumps 137 are provided on the lower surface side of the wiring board 133.

Next, based on FIGS. 40 and 41, a wire bonding type QFP (a resin package using a lead frame) will be described below. As shown in FIGS. 40 and 41, the device chip 101 (semiconductor chip) is die-bonded via the adhesive layer 130 (for example, a die attach film or a die bond paste, or the like) over a die pad 145 held by four die pad support bars 146. A plurality of surface metal layers 115 (on the bonding pad) are provided over the upper surface of the device chip 101, and are coupled to lead portions 131 by the bonding wires 132. In this example, bonding balls 134 are made on the surface metal layer 115 side. The inside of the lead 131, the die pad support bars 146, the die pad 145, the device chip 101, and the bonding wires 132 are sealed with a resin sealing member 181 (sealing resin).

Further, the flip chip type BGA (for example, flip chip bonding by gold based stud bump) will be described below based on FIGS. 42 to 44. As shown in FIGS. 42 to 44, a plurality of land pads 155 are provided on the wiring board 133. Gold stud bumps 157 (which may be copper-based one) under the surface metal layers 115 (bonding pads) on the lower surface of the device chip 101 are coupled to the land pads 155 via a solder layer 156 (for example, lead-free solder or the like comprised of 3.5% by weight silver and a balance including tin). The coupling is reinforced by an underfill resin 148 (for example, an epoxy resin containing silica powder or the like). Solder bumps 137 for external coupling (for example, lead-free solder comprised of 3.5% by weight silver, 0.5% by weight copper, and a balance including tin) are provided on the lower surface of the wiring board 133.

6. Explanation of Wafer Probe Inspection in Manufacturing Method of Semiconductor Integrated Circuit Device or the Like in One Embodiment of Present Application (Mainly See FIGS. 27 to 32)

This section will further describe the probe test 215 and the wire bonding process at step S219 which has been described above in Section 3 based on FIG. 2.

Figure 27:
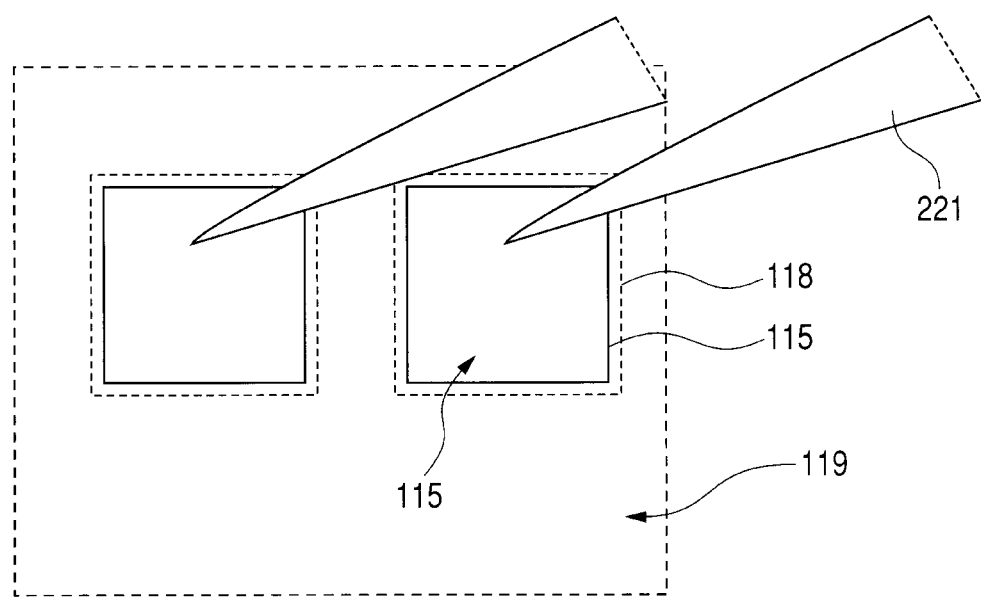
FIG. 27 is an enlarge view of a top surface of a wafer (square pad in a first example) showing a state of a wafer probe test process in the manufacturing procedure of the semiconductor integrated circuit device in the embodiment of the present application.
Figure 28:
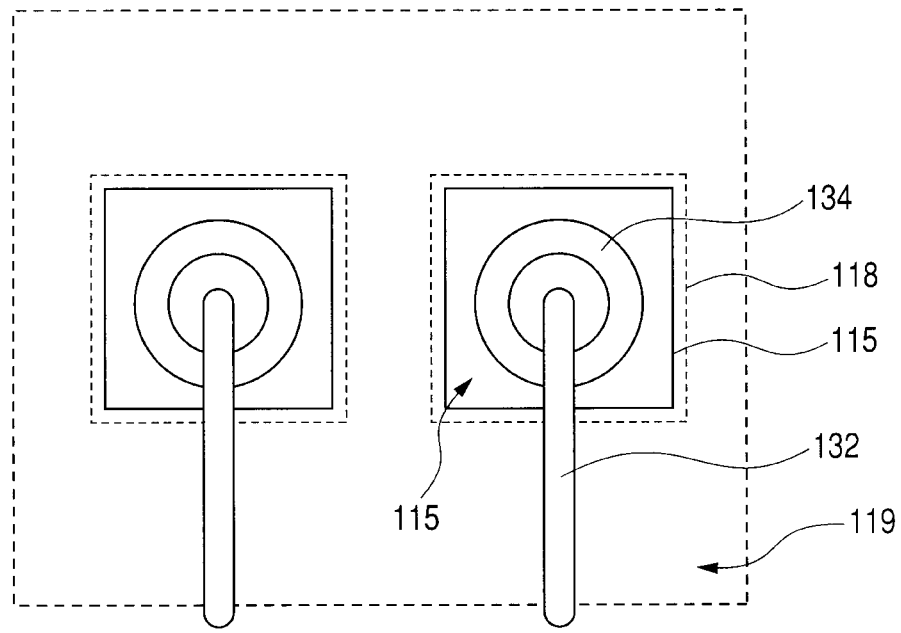
FIG. 28 is an enlarge view of the top surface of the wafer (square pad in the first example) at the time of completion of the wire bonding process in the example corresponding to FIG. 27.
Figure 29:
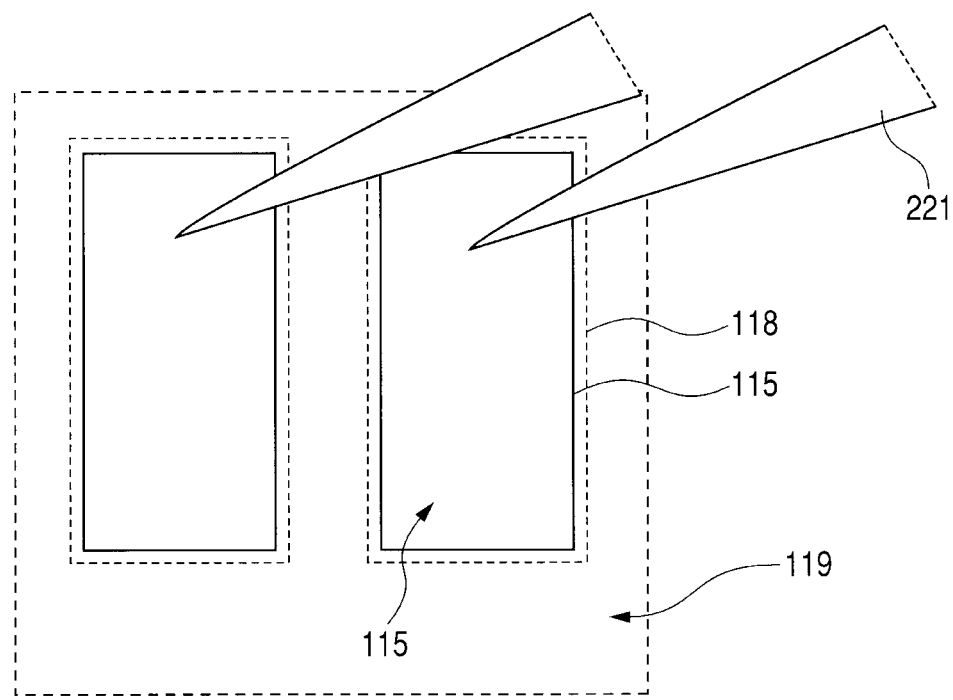
FIG. 29 is an enlarge view of a top surface of another wafer (normal type rectangular pad in a second example) showing the state of the wafer probe test process in the manufacturing procedure of the semiconductor integrated circuit device in the embodiment of the present application.
Figure 30:
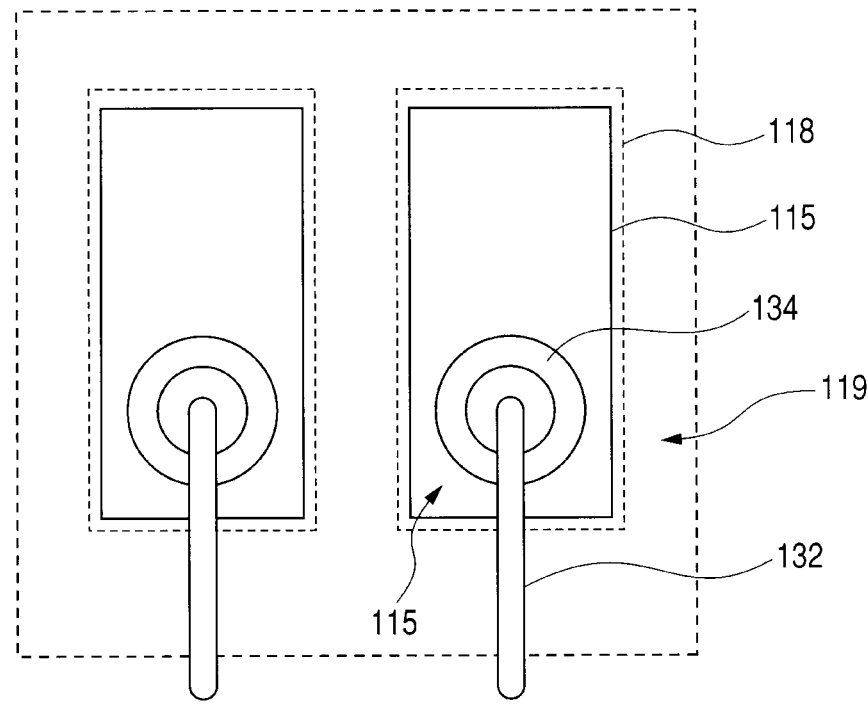
FIG. 30 is an enlarge view of the top surface of the wafer (normal rectangular pad in the second example) at the time of completion of the wire bonding process in the example corresponding to FIG. 29.
Figure 31:
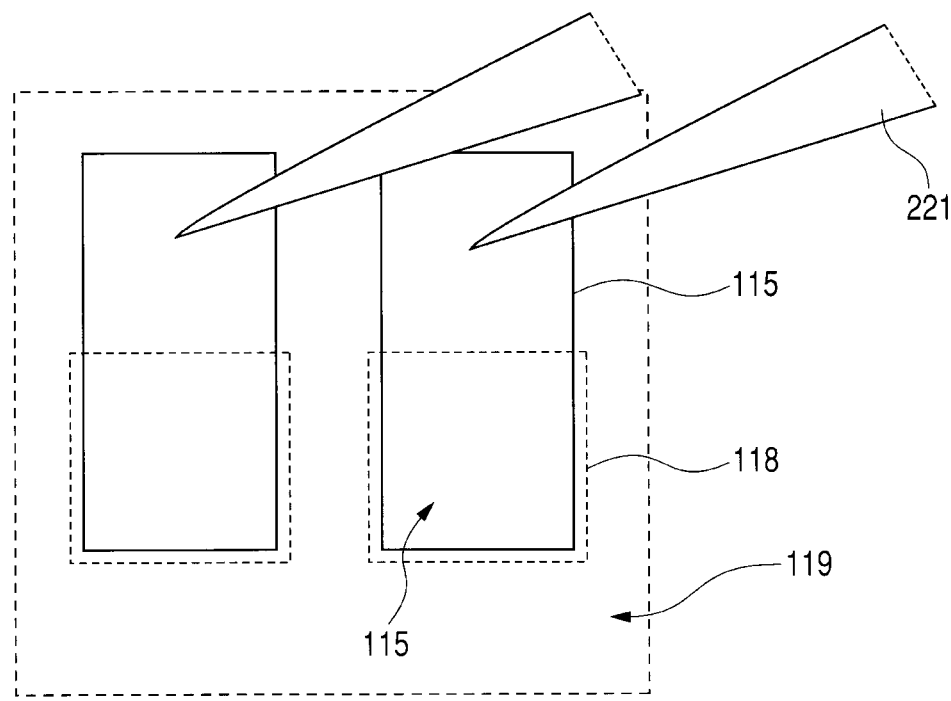
FIG. 31 is an enlarge view of a top surface of a further wafer (modified rectangular pad in a third example) showing the state of the wafer probe test process in the manufacturing procedure of the semiconductor integrated circuit device in the embodiment of the present application.
Figure 32:
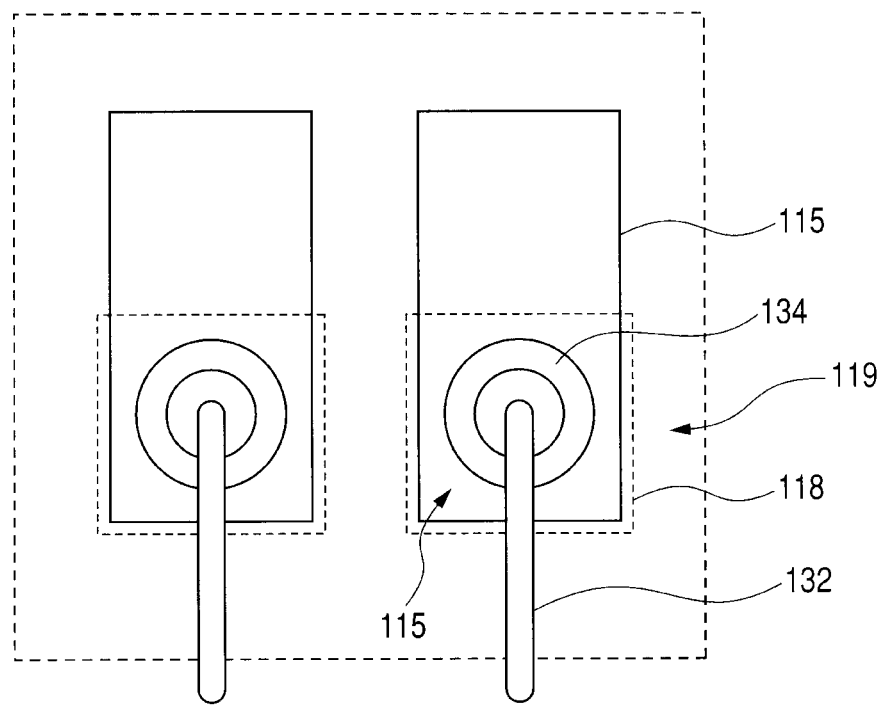
FIG. 32 is an enlarge view of the top surface of the wafer (modified rectangular pad in the third example) at the time of completion of the wire bonding process in the example corresponding to FIG. 31.

FIG. 27 is an enlarged view of a top surface of a wafer (square pad in a first example) showing a state of the wafer probe test process in the manufacturing procedure of the semiconductor integrated circuit device in the embodiment of the present application. FIG. 28 is an enlarged view of the top surface of the wafer (square pad in the first example) at the time of completion of the wire bonding process in the example corresponding to FIG. 27. FIG. 29 is an enlarged view of a top surface of another wafer (normal type rectangular pad in a second example) showing the state of the wafer probe test process in the manufacturing procedure of the semiconductor integrated circuit device in the embodiment of the present application. FIG. 30 is an enlarged view of the top surface of the wafer (normal rectangular pad in the second example) at the time of completion of the wire bonding process in the example corresponding to FIG. 29. FIG. 31 is an enlarged view of a top surface of a further wafer (modified rectangular pad in a third example) showing the state of the wafer probe test process in the manufacturing procedure of the semiconductor integrated circuit device in the embodiment of the present application. FIG. 32 is an enlarged view of the top surface of the wafer (modified rectangular pad in the third example) at the time of completion of the wire bonding process in the example corresponding to FIG. 31. Based on the above description, the relationship or the like among the shapes of the bonding pad and the surface metal layer (also including the orientation), a probe needle, and the bonding wire will be described below.

First, the probe test process using the square pad at step S215 (see FIG. 2) will be described below based on FIG. 27. As shown in FIG. 27, the surface metal layer 115 and the bonding pad 118 are concentrically positioned (substantially sharing the center) with the homothetic shape (note that in this case, the bonding pad 118 is slightly larger than that of the metal layer 115). Parts other than the surface metal layer 115 and the bonding pad 118 are almost covered with a plasma SiN 119 (inorganic final passivation film on the pad) or the like. In the probe test 215, a plurality of probe needles 221 are in contact with the respective surface metal layers 115. The surface metal layer 115 comprised of gold-based metal material (metal including high-purity gold, or gold as a principal component) has excellent contactability. This is because the gold-based metal material hardly generates a natural oxide film on its surface, which inevitably leads to reduced contact damage (also resulting in relatively small contact load and over-drive amount). This is effective especially in use of a Low-k film or the like which is mechanically fragile, as a wiring interlayer insulating film under the pad.

Now, the wire bonding process at step S219 by use of the square pad will be described below based on FIG. 28. As shown in FIG. 28, in this case, bonding of the bonding wire 132 (bonding balls 134) is performed in the same position as the position with which the probe needle 221 is brought into contact in the probe test process at step S215. The presence of the surface metal layer 115 has the merit of not causing adverse effect on bonding properties because of small contact damage (without leaving so much as a contact trace), unlike the case where the contact trace is left due to peeling of an Al pad.

The probe test process at step S215 and the wire bonding process at step S219 (see FIG. 2) using the normal rectangular pad will be described below based on FIGS. 29 and 30. As shown in FIGS. 29 and 30, the surface metal layer 115 and the bonding pad 118 are concentrically positioned (substantially sharing the center) with the homothetic shape as viewed planarly (note that in this case, the bonding pad 118 is slightly larger than that of the metal layer 115). In this embodiment, however, since the surface metal layer 115 and the bonding pad 118 are rectangular, wire bonding can be performed in a position different from the position with which the probe needle 221 is in contact. Thus, in various kinds of probe tests, for example, repeated inspection (re-inspection) processes or the like are performed. Even when the contact damage may become relatively large, the influence on the wire bonding can be avoided.

Next, the probe test process at step S215 and the wire bonding process at step S219 (see FIG. 2) using a modified rectangular pad will be described based on FIGS. 31 and 32. As shown in FIGS. 31 and 32, the surface metal layer 115 has a rectangular shape, and the bonding pad 118 has a substantially square shape as viewed planarly. The layer 115 and the pad 118 are partially superimposed on each other, but displaced from each other, in terms of orientation or positional relationship. A part of each surface metal layer 115 without the bonding pad 118 is formed over the plasma SiN (inorganic final passivation film on the pad) 119 via the under bump metal layer (barrier and seed metal layer) 67. Therefore, the same merits as those of the above-mentioned normal rectangular pad can be obtained. In general, a cushion material (impact buffer layer), such as the bonding pad 118 desirably exists under a part to be probed. The surface metal layer 115 comprised of gold-based metal material can ensure its hardness, and can reduce the contact damage to a relatively small level in many cases. Thus, even when the probe needle 221 is in contact with the part of the layer 115 without the bonding pad 118 under the part as shown in FIG. 31, the damage to the lower plasma SiN film (inorganic final passivation film on the pad) 119 can be reduced. Wire bonding points can be provided in positions for allowing bonding on the surface metal layer 115. As shown in FIG. 32, the wire bonding points are set in the part with the bonding pad 118 thereby to enable reduction in probability of occurrence of the damage.

7. Explanation of Metal Layer Structure (or Under Bump Metal Structure) Under Each Type of Surface Metal Layer of Semiconductor Integrated Circuit Device in One Embodiment of Present Application (Mainly See FIGS. 45 to 47)

Various types of metal layer structures under the surface metal layer as described above will be further described in more detail.

Figure 45:
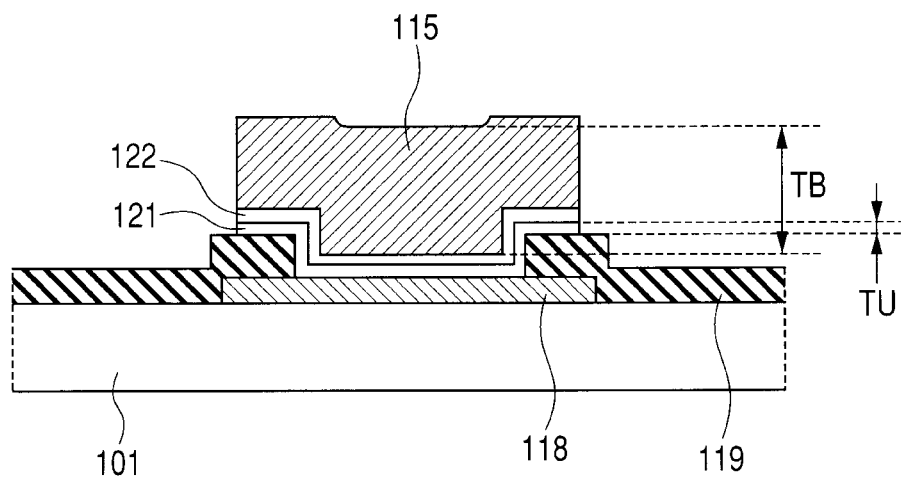
FIG. 45 is a cross-sectional view of the periphery of the pad for explaining one type of under bumb metal structure (two-layered structure) in the semiconductor integrated circuit device of the embodiment of the present application.
Figure 46:
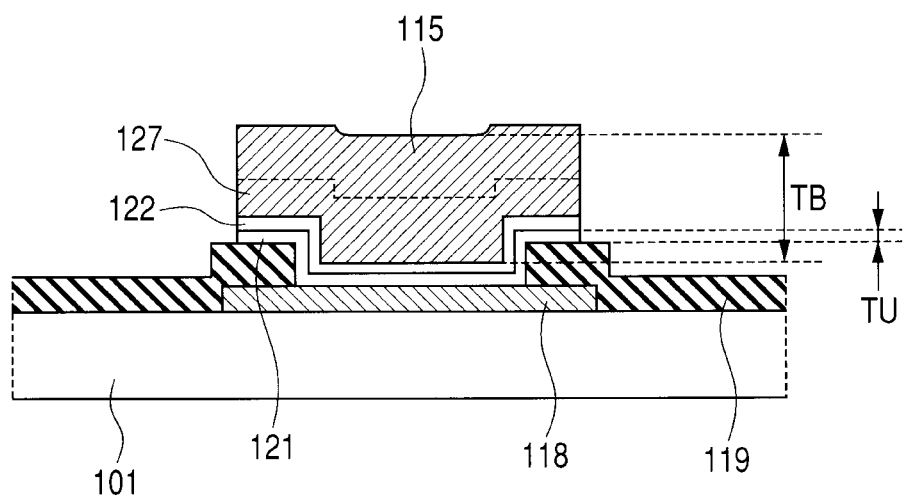
FIG. 46 is a cross-sectional view of the periphery of the pad in a modified example of FIG. 45.
Figure 47:
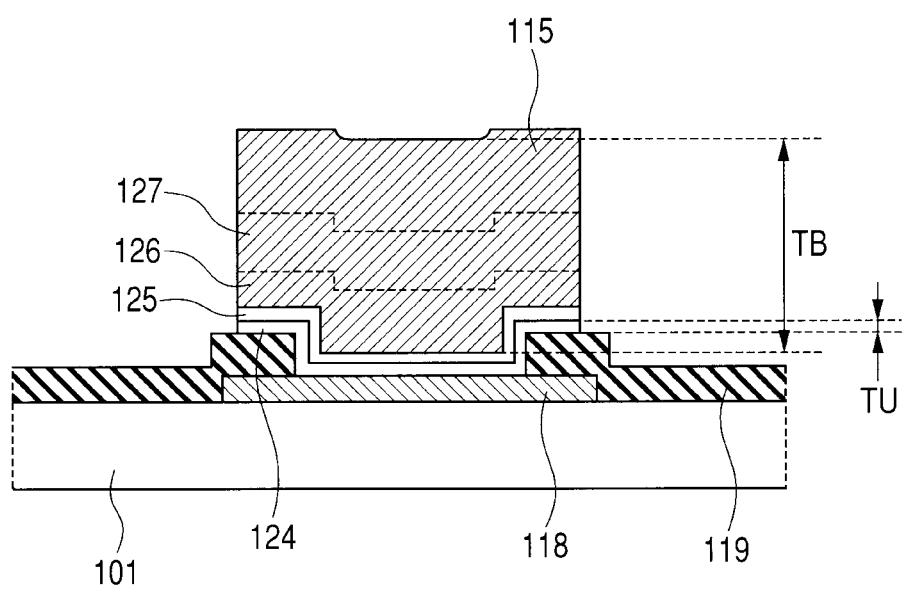
FIG. 47 is a cross-sectional view of the periphery of the pad for explaining another type of underbumb metal structure (three or more-layered multilayer structure) in the semiconductor integrated circuit device of the embodiment of the present application.

FIG. 45 is a cross-sectional view of the periphery of the pad for explaining one type of underbumb metal structure (two-layered structure) in the semiconductor integrated circuit device of one embodiment of the present application. FIG. 46 is a cross-sectional view of the periphery of the pad in a modified example of FIG. 45. FIG. 47 is a cross-sectional view of the periphery of the pad for explaining another type of underbumb metal structure (three or more-layered multilayer structure) in the semiconductor integrated circuit device of one embodiment of the present application.

First, based on FIG. 45, the metal layer structure under the basic surface metal layer of the semiconductor integrated circuit device in the embodiment of the present application will be described below. In this case, as shown in FIG. 45, for example, the barrier metal film 121 including titanium as a principal component is laminated on the aluminum-based bonding pad 118 (for example, in a thickness of about 0.175 µm by sputtering deposition).

On the barrier metal film, the seed metal film 122 including palladium as a principal component is laminated (for example, in a thickness of about 0.175 µm by the sputtering deposition). Then, on the metal film 122, an electrolytic gold plated bump electrode 115 (gold bump, surface metal layer, or overpad metal) including gold as a principal component is laminated (for example, in a thickness of about 2.8 µm, for example, in a range of about 1 to 3 µm). The titanium film 121 is an interdiffusion barrier film against aluminum and gold. The palladium film 122 is a seed film for forming the electrolytic gold plated surface metal layer 115.

Referring to FIG. 46, a modified one of the example shown in FIG. 45 will be described below. As shown in FIG. 46, this structure includes an electrolytic nickel plated layer 127 (whose thickness is, for example, about 2 µm) intervening between the seed metal film 122 and the electrolytic gold plated surface metal layer 115. Nickel is harder than gold or the like, which effectively reduces the damage due to the wire bonding.

Based on FIG. 47, one example of the under bump metal structure with three or more-multilayered structure will be described below. In this case, as shown in FIG. 47, for example, the barrier metal film 124 including chrome as a principal component is laminated on the aluminum-based bonding pad 118 (for example, in a thickness of about 0.075 µm by sputtering deposition). On the barrier metal film, a seed metal film 125 including copper as a principal component is laminated (for example, in a thickness of about 0.25 µm by the sputtering deposition). Then, an electrolytic copper plated layer 126 including copper as a principal component is laminated on the metal film 125 (for example, in a thickness of about 2 µm, for example, in a range of about 1 to 10 µm if necessary). Further, on the plated layer 126, an electrolytic nickel plated layer 127 including nickel as a principal component is laminated (in the thickness of about 2 µm). On the plated layer 127, an electrolytic gold plated bump electrode 115 including gold as a principal component (gold bump, surface metal layer, or overpad metal film) is laminated (in a thickness of about 2.8 µm, for example, in a range of about 1 µm to about three µm). The chrome film 124 is an interdiffusion barrier film against aluminum and copper. The copper film 125 is a seed film for forming the electrolytic copper plated film 126.

This structure has the features that the nickel layer and the copper layer which are relatively thick and hard are formed under the electrolytic gold plated bump electrode 115, and thus can effectively reduce the damage due to the wire bonding. Additionally, the structure can be used as a wiring line (re-wiring line with a low resistance) comprised of the nickel layer and the copper layer with high reliability. Further, the structure can also effectively reduce the resistance of an external terminal.

8. Consideration Regarding Various Embodiments (Mainly See FIG. 26, and FIGS. 33 to 37)

This section will provide a description or another supplemental description of the features and technical effects or the like common to or specific to the respective embodiments.

Figure 26:
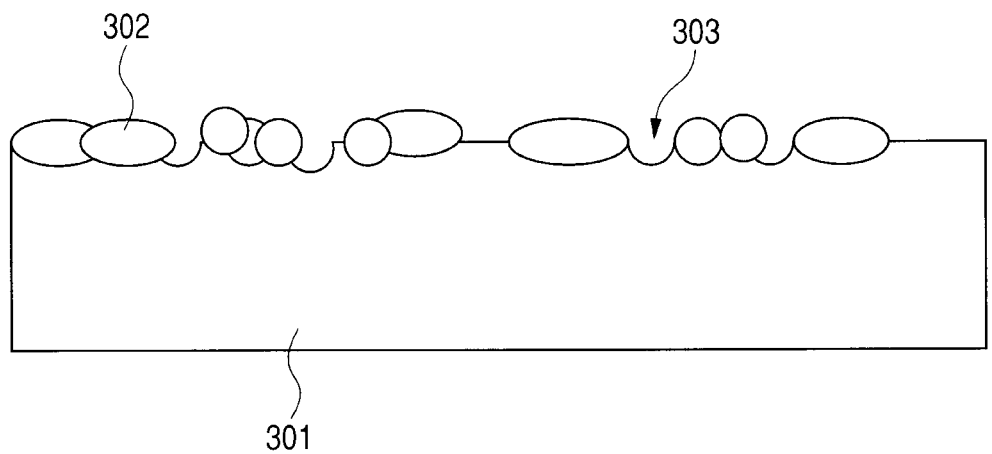
FIG. 26 is an explanatory cross-sectional view for explaining problems of nonelectrolytic gold plating on a nickel surface.
Figure 33:
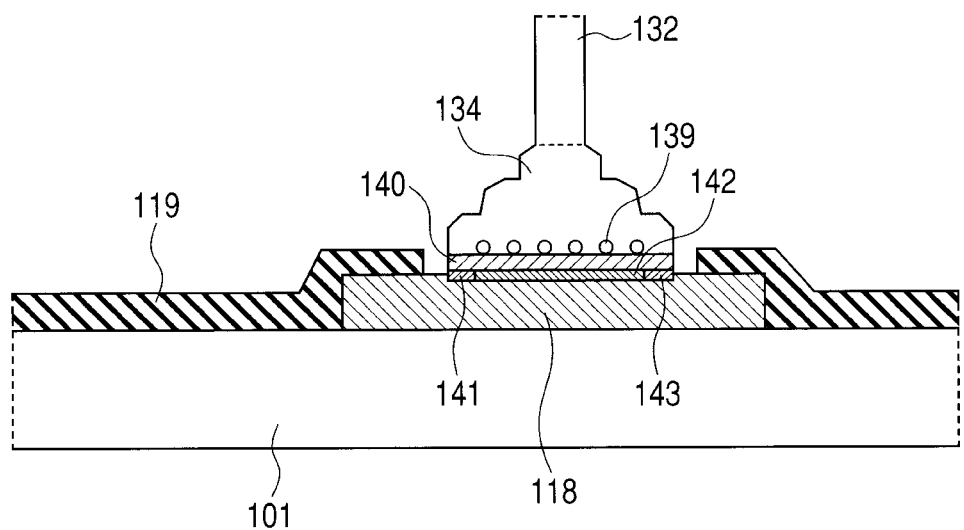
FIG. 33 is a local exemplary cross-sectional view of an aluminum pad and a bonding wire for explaining Kirkendall Void generated in bonding between aluminum and gold.
Figure 34:
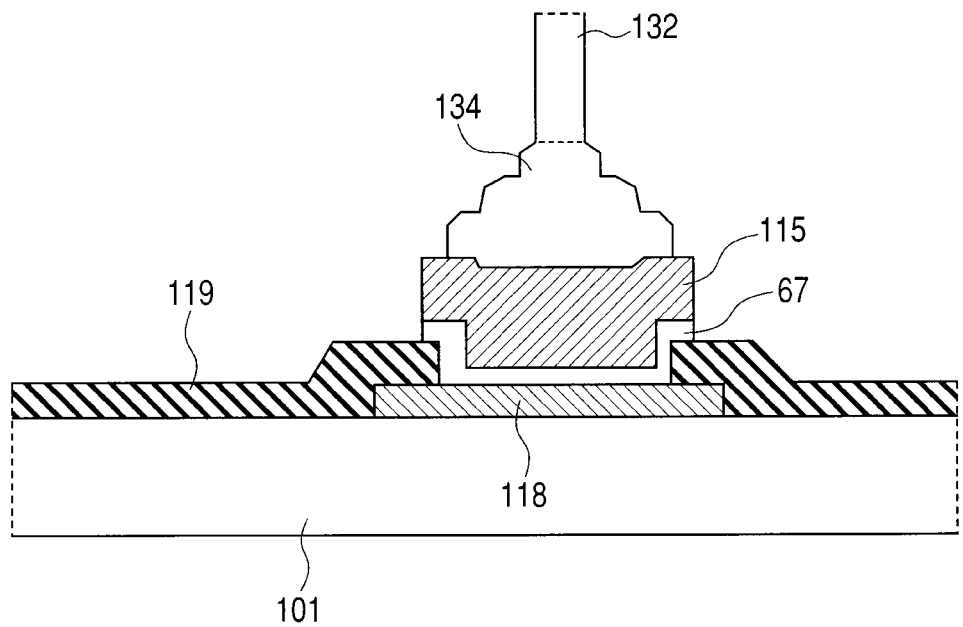
FIG. 34 is a local cross-sectional view showing one of various examples (normal mode) of a bonded state of the bonding wire on the pad at the semiconductor integrated circuit device in the embodiment of the present application.
Figure 35:
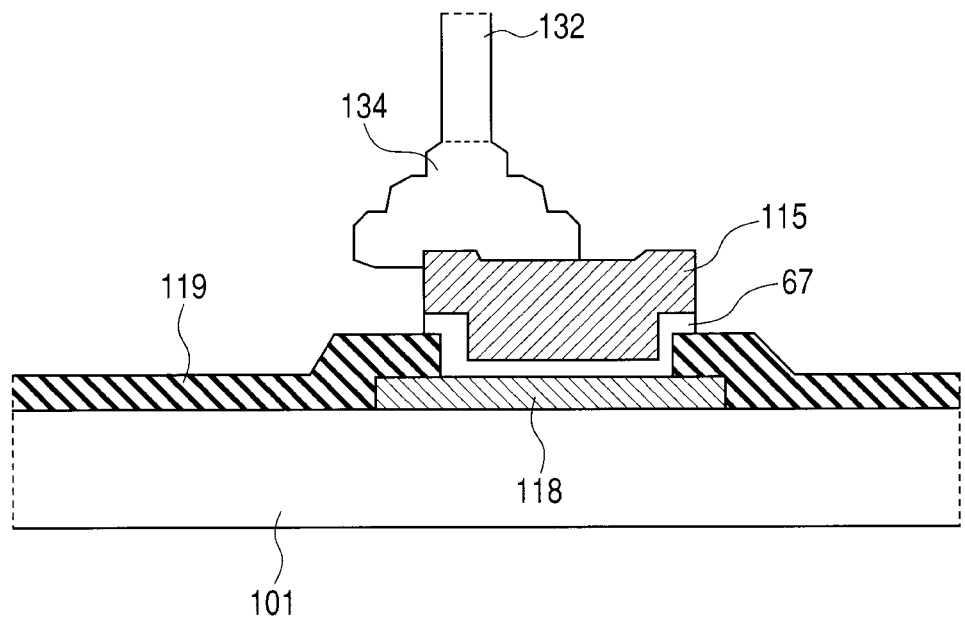
FIG. 35 is a local cross-sectional view showing one of various examples (lateral sliding mode 1) of a bonded state of the bonding wire on the pad at the semiconductor integrated circuit device in the embodiment of the present application.
Figure 36:
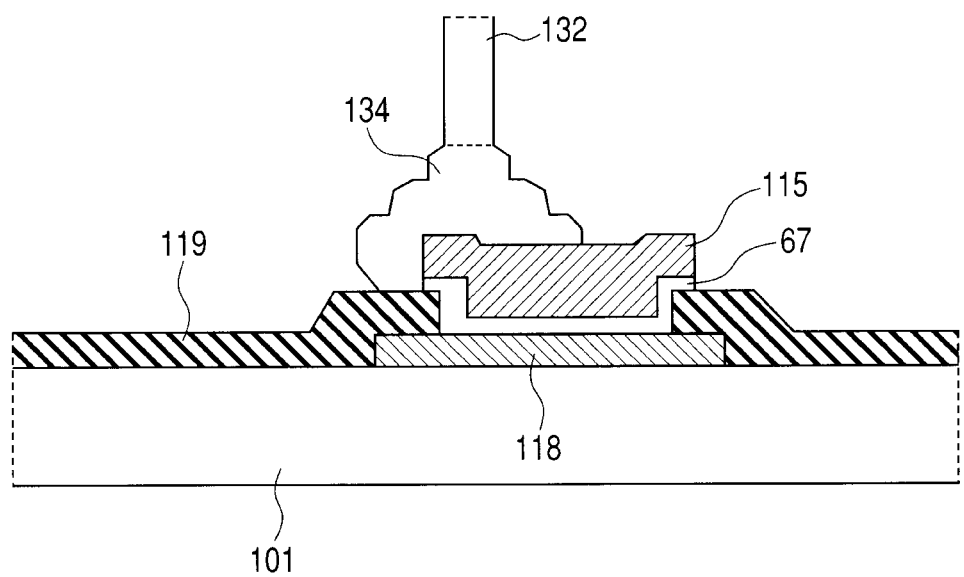
FIG. 36 is a local cross-sectional view showing one of various examples (lateral sliding mode 2) of a bonded state of the bonding wire on the pad at the semiconductor integrated circuit device in the embodiment of the present application.
Figure 37:
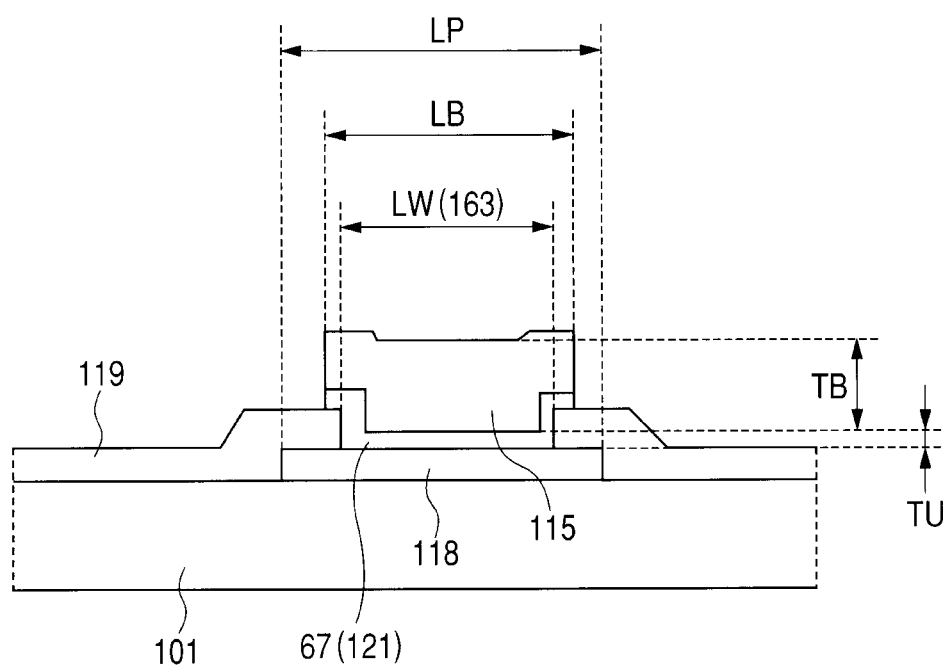
FIG. 37 is a local cross-sectional view for explaining the relationship among various dimensions of a bonded structure of the bonding wire on the pad at the semiconductor integrated circuit device in the embodiment of the present application.

FIG. 26 is an explanatory cross-sectional view for explaining problems of nonelectrolytic gold plating on a nickel surface. FIG. 33 is a local exemplary cross-sectional view of an aluminum pad and a bonding wire for explaining Kirkendall Void caused in bonding between aluminum and gold. FIG. 34 is a local cross-sectional view showing one of various examples (normal mode) of a bonded state of the bonding wire on the pad at the semiconductor integrated circuit device in the embodiment of the present application. FIG. 35 is a local cross-sectional view showing one of various examples (lateral sliding mode 1) of a bonded state of the bonding wire on the pad in the semiconductor integrated circuit device of the embodiment of the present application. FIG. 36 is a local cross-sectional view showing one of various examples (lateral sliding mode 2) of a bonded state of the bonding wire on the pad in the semiconductor integrated circuit device of the embodiment of the present application. FIG. 37 is a local cross-sectional view for explaining the relationship among various dimensions of a bonded structure of the bonding wire on the pad at the semiconductor integrated circuit device in the embodiment of the present application.

First, the problems with the use of nonelectrolytic gold plating (which is not limited to gold, and thus may be replaced by copper or nickel), instead of the electrolytic gold plating, will be described based on FIG. 26 by taking the case of the nonelectrolytic gold plating (displacement gold plating) on a nickel surface 301 as an example. As shown in FIG. 26, the nonelectrolytic gold plated film is formed by attaching a gold member 302 to apart 303 lacking nickel as underlying metal. Gold plated areas 302 themselves are in the porous state because a plating reaction is stopped while covering the surface. Then, nickel elements are apt to be easily deposited from the porous parts, and the deposited nickel elements are oxidized to form nickel oxides (NiO). The presence of the nickel oxide on the gold plating area 302 makes it difficult to bond the bonding wire, and causes the wire to be easily peeled off even if the wire is attached. Since the plating reaction is stopped on a stage where the gold plated areas 302 cover the surface, it is generally difficult to ensure the plating thickness of about 100 nm (or about 0.1 μm) or more. Further, an interface between the nickel surface 301 and the gold plated areas 302 has voids formed therein, and thus cannot ensure adequate bonding (adhesive) property, which easily causes peeling of a gold layer (interfacial peeling).

In contrast, in the electrolytic plating process, the plating reaction proceeds by an electric field from the external side, and can form a dense plated film, and further can make the formed plating film thicker than that of a film subjected to the nonelectrolytic gold plating. It is apparent that this is not limited to the case where an underlayer is made of nickel.

Based on FIG. 33, the following describes the problems with direct bonding of a bonding wire of gold-based material or the like (or bonding balls) to the aluminum-based pad without the surface metal layer 115 of gold-based material or the like on the aluminum pad. When the bonding wire made of gold-based material or the like is held under a relatively low temperature (for example, of about 150 degrees C.) for a long time while being directly coupled to the aluminum-based pad, as shown in FIG. 33, Au—Al based intermetallic compound layers 140, 141, 142 and 143 (for example, $Au_4Al$ layer 140, $Au_2Al$ layer 141, $Au_5Al_2$ layer 142, and $AuAl_2$ layer 143) appear near the interface between the aluminum material and gold material. Together with the state, voids 139 (Kirkendall Void) are generated on a bonding ball 134 side, which may cause break of connection or coupling. This is because the diffusion velocity of gold element into the Au—Al based intermetallic compound layers 140, 141, 142, and 143 is much faster than that of aluminum element into the Au—Al based intermetallic compound layers 140, 141, 142, and 143. That is, gold ions move to the aluminum pad 118 at high speed, which results in generating a number of vacancies to be gradually condensed into voids.

In contrast, the intervention of the surface metal layer 115 of gold-based material or the like over the aluminum pad 118 via the barrier layer can ensure the bonding property, and also effectively prevent the occurrence of voids.

Based on FIGS. 34 to 36, the following describes various types of bonding modes of the gold-based (or copper-based) bonding wire 132 or 115 (or bonding ball 134) to the surface metal layer 115 comprised of gold-based material or the like. FIG. 34 shows a normal mode. That is, the bonding ball 134 is accommodated within an upper surface of the surface metal layer 115. The example shown in FIG. 35 is one of sliding modes in which a main bonding portion (center of the ball) of the bonding ball 134 is accommodated within the upper surface of the surface metal layer 115. This mode is not problematic from the viewpoint of properties. The example shown in FIG. 36 is another sliding mode in which a main bonding portion (center of the ball) of the bonding ball 134 is accommodated within the upper surface of the surface metal layer 115 with the ball 134 itself deformed or the ball 134 changing the shape of the end of the surface metal layer 115, so that the lower end of the ball 134 reaches the surface of a plasma SiN film (inorganic final passivation film on the pad) 119. Also, in this case, cracks or the like rarely occur in the plasma SiN (inorganic final passivation film on the pad) 119 or the like because of the shock absorption effect of the surface metal layer 115. There are few problems with the properties of products. Accordingly, the main features described above can be applied to any one of the cases shown in FIGS. 34 to 36. In other words, in the cases shown in FIGS. 34 to 36, the main part of the wire bonding portion can be located substantially directly above the bonding pad as a whole.

Now, referring to FIG. 37 (FIGS. 28, 30, 32, and 45 to 47), the bonding structure of the bonding wire on the pad in the semiconductor integrated circuit device of each embodiment of the present application, that is, the relationship among various dimensions of an over pad metal structure, will be described below. As shown in FIG. 37, in the normal layout (normal structure), the width LP of the pad is largest in all directions, the width LW of a pad opening is smallest in all directions, and the width LB of the surface metal layer is middle in all directions. Thus, as viewed planarly, the surface metal layer 115 is located within the bonding pad 118 (note that the surface metal layer 115 is smaller than that of the pad in terms of area). Likewise, the bonding pad opening 163 is located within the surface metal layer 115 (note that the bonding pad opening 163 is smaller than that of the metal layer in terms of area).

The abnormal structure shown in FIG. 32 only satisfies such size relationship and inclusive relationship in the specific lateral direction, and does not entirely satisfy those relations in the longitudinal direction.

Likewise, as shown in FIG. 37, in the normal structure, the thickness TB of the surface metal layer (or the thickness equivalent thereto) is larger than the thickness TU of the barrier metal layer (in general, the thickness of the barrier metal film 121). The reason why the surface metal layer 115 is relatively thick in this way is that the metal layer 115 is to substantially ensure the properties or functions of the bonding pad. However, the thickness TB of the surface metal layer is supposed to become substantially the same as the thickness TU of the barrier metal layer by changing peripheral parameters or the like. Both thicknesses may have the reverse relationship. Thus, the surface metal layer is not limited to the electrolytic plated one, but may be formed by sputtering deposition or nonelectrolytic plating when the surface metal layer is thin or partly formed. In particular, the sputtering deposition is a process method involving photoetching the film formed over the entire wafer, which has demerits of generation of an unnecessary (disposed) part, and warpage of the wafer due to strong internal stress in the film in many cases. But the method has a merit of being capable of forming a very clean film as compared to the plated film.

As shown in FIGS. 46 and 47, when electrolytic metal layers are formed over the barrier metal layer 121 (or barrier and seed metal layer 67), the entire thickness of these electrolytic metal layers is theoretically consistent with the thickness TB of the surface metal layer. When the seed metal layer (made of, for example, copper), and the upper electrolytic plated layer (made of, for example, copper) are of the same quality, in fact, the seed metal layer is preferably adapted to form a part of the electrolytic plated layer in the thickness direction.

Referred to FIG. 37, the width LB of the surface metal layer can be larger than the width LP of the pad in a certain orientation or direction like FIG. 32. Such a structure can enhance flexibility in bonding point (position for the wire bonding). Likewise, the width LB of the surface metal layer can be larger than the width LP of the pad in all orientations or directions. Further, the width LB of the surface metal layer can be smaller than the width LW of the pad opening in a certain orientation or direction (or in all orientations or directions). This structure can have merits of reducing the amount of consumption of gold, and increasing the flexibility in various layouts.

9. Summary

Although the invention made by the inventors has been specifically described based on the preferred embodiments, the invention is not limited thereto. It will be apparent to those skilled in the art that various modifications can be made to the presently disclosed embodiments without departing from the scope of the invention.

For example, although this embodiment has specifically described the semiconductor chip with a damascene interconnection, such as a copper damascene interconnection, (embedded wiring containing copper, silver, or the like as a principal wiring element), the invention is not limited thereto. It is apparent that the invention can also be applied to the use of a semiconductor chip with aluminum-based normal wiring (non-embedded wiring).

In the above embodiments, material for the bonding wire or bonding ball (including stud bumps) is mainly, for example, a gold-based wire. It will be apparent that the bonding wire can be applied to the gold-based wire (high-purity gold, or gold with various kinds of additives added thereto), a copper-based wire (high-purity copper, oxygen-free copper, or copper with various kinds of additives added thereto), a palladium-based wire (metal material containing palladium as a principal component), or the like in the same way.

The invention claimed is:

1. A method of manufacturing a semiconductor device, comprising:
    (a) providing a semiconductor chip having:
        a main surface on which a first pad and a second pad arranged next to the first pad are provided,
        a passivation film formed on the main surface of the semiconductor chip such that a first part of the first pad and a second part of the second pad are exposed from the passivation film,
        a first surface-metal layer provided over the first part of the first pad and a first part of the passivation film, and
        a second surface-metal layer provided over the second part of the second pad and a second part of the passivation film,
    wherein, in plan view, a width of the first surface-metal layer is less than a width of the first pad,
    wherein, in plan view, a width of the second surface-metal layer is less than a width of the second pad,
    wherein the width of each of the first surface-metal layer, the second surface-metal layer, the first pad and the second pad is a respective dimension along the main surface of the semiconductor chip and, in plan view, in a direction along which the first pad and the second pad are arranged,
    wherein each of the first surface-metal layer and the second surface-metal layer is comprised of nickel,
    wherein, in cross-section view, an upper surface of each of the first and second surface-metal layers is not covered with the passivation film or any other passivation films formed over the main surface of the semiconductor chip, such that an entirety of the respective upper surfaces of the first and second surface-metal layers is exposed to an outside of the semiconductor chip,
    wherein the passivation film has a third part located between the first pad and the second pad in cross-section view, and
    wherein, in cross-section view, a surface of the third part is located closer to the main surface of the semiconductor chip than an uppermost surface of the first part of the passivation film and than an uppermost surface of the second part of the passivation film, the uppermost surface of the first part of the passivation film being located between the first pad and a portion of the first surface-metal layer that is provided over the first part of the passivation film, the uppermost surface of the second part of the passivation film being located between the second pad and a portion of the second surface-metal layer that is provided over the second part of the passivation film;
    (b) after (a), electrically connecting a first wire with the first surface-metal layer by wire bonding, and electrically connecting a second wire with the second surface-metal layer by wire bonding; and
    (c) after (b), sealing the semiconductor chip, the first wire and the second wire with a resin.

2. The method according to claim 1, wherein the semiconductor chip has a number of devices and wirings therein.

3. The method according to claim 1, wherein the passivation film is comprised of an inorganic film.

4. The method according to claim 1, wherein the passivation film is comprised of an organic film.

5. The method according to claim 1,
    wherein each of the first and second wires is comprised of copper, and
    wherein each of the first and second pads is comprised of aluminum.

6. The method according to claim 1,
    wherein the first surface-metal layer comprises:
        a first layer comprised of gold,
        a second layer comprised of titanium and located between the first layer and the first pad, and
        a third layer comprised of nickel and located between the first layer and the second layer, and
    wherein the second surface-metal layer comprises:

a fourth layer comprised of gold,
a fifth layer comprised of titanium and located between the fourth layer and the second pad, and
a sixth layer comprised of nickel and located between the fourth layer and the fifth layer.

7. The method according to claim 6,
wherein the first surface-metal layer further comprises palladium, and
wherein the second surface-metal layer further comprises palladium.

8. The method according to claim 1, wherein the upper surface of the first surface-metal layer with which the first wire is electrically connected and the upper surface of the second surface-metal layer with which the second wire is electrically connected are not covered with the passivation film.

9. The method according to claim 1, wherein, in (c), the semiconductor chip, the first wire and the second wire are sealed with the resin such that the resin contacts the surface of the third part of the passivation film.

10. The method according to claim 1,
wherein, in (b), the first wire is electrically connected with the first surface-metal layer, while applying a load in a thickness direction of the first pad, and
wherein, in (b), the second wire is electrically connected with the second surface-metal layer, while applying a load in a thickness direction of the second pad.

11. The method according to claim 1,
wherein, after (a) and before (b), the semiconductor chip is mounted on a substrate having a first lead and a second lead,
wherein the first wire has a first ball at an end thereof,
wherein the second wire has a second ball at an end thereof,
wherein, in (b), the first and second pads are electrically connected with the first and second leads via the first and second wires, respectively,
wherein the first and second balls of the first and second wires are electrically connected with the first and second surface-metal layers, respectively, by ball bonding, and
wherein other parts of the first and second wires are electrically connected with the first and second leads, respectively, by wedge bonding.

12. A method of manufacturing a semiconductor device, comprising:
(a) providing a semiconductor chip having:
a main surface on which a first pad and a second pad arranged next to the first pad are provided, each of the first and second pads being comprised of aluminum,
a passivation film formed on the main surface of the semiconductor chip such that a first part of the first pad and a second part of the second pad are exposed from the passivation film,
a first surface-metal layer provided over the first part of the first pad and a first part of the passivation film, and
a second surface-metal layer provided over the second part of the second pad and a second part of the passivation film,
wherein, in plan view, a width of the first surface-metal layer is less than a width of the first pad,
wherein, in plan view, a width of the second surface-metal layer is less than a width of the second pad,
wherein the width of each of the first surface-metal layer, the second surface-metal layer, the first pad and the second pad is a respective dimension along the main surface of the semiconductor chip, and, in plan view, in a direction along which the first pad and the second pad are arranged,
wherein each of the first surface-metal layer and the second surface-metal layer is comprised of nickel,
wherein, in cross-section view, an upper surface of the first surface-metal layer with which a first wire is to be electrically connected and an upper surface of the second surface-metal layer with which a second wire is to be electrically connected are not covered with the passivation film or any other passivation films formed over the main surface of the semiconductor chip, such that an entirety of the respective upper surfaces of the first and second surface-metal layers is exposed to an outside of the semiconductor chip,
wherein the passivation film has a third part located between the first pad and the second pad in cross-section view, and
wherein, in cross-section view, a surface of the third part is located closer to the main surface of the semiconductor chip than an uppermost surface of the first part of the passivation film and than an uppermost surface of the second part of the passivation film, the uppermost surface of the first part of the passivation film being located between the first pad and a portion of the first surface-metal layer that is provided over the first part of the passivation film, the uppermost surface of the second part of the passivation film being located between the second pad and a portion of the second surface-metal layer that is provided over the second part of the passivation film;
(b) after (a), electrically connecting the first wire with the first surface-metal layer by wire bonding, and electrically connecting the second wire with the second surface-metal layer by wire bonding, each of the first and second wires being comprised of copper; and
(c) after (b), sealing the semiconductor chip, the first wire and the second wire with a resin, and contacting the resin with the surface of the third part of the passivation film.

13. The method according to claim 12, wherein the semiconductor chip has a number of devices and wirings therein.

14. The method according to claim 12, wherein the passivation film is comprised of an inorganic film.

15. The method according to claim 12, wherein the passivation film is comprised of an organic film.

16. The method according to claim 12,
wherein each of the first surface-metal layer and the second surface-metal layer is comprised of:
a first layer comprised of nickel, and
a second layer comprised of gold and formed over the first layer.

17. The method according to claim 12,
wherein, in (b), the first wire is electrically connected with the first surface-metal layer, while applying a load in a thickness direction of the first pad, and
wherein, in (b), the second wire is electrically connected with the second surface-metal layer, while applying a load in a thickness direction of the second pad.

18. The method according to claim 12,
wherein, after (a) and before (b), the semiconductor chip is mounted on a substrate having a first lead and a second lead,
wherein the first wire has a first ball at an end thereof, wherein the second wire has a second ball at an end thereof, wherein, in (b), the first and second pads are electrically connected with the first and second leads via the first and second wires, respectively, wherein the first and second balls of the first and second wires are electrically connected with the first and second surface-metal layers, respectively, by ball bonding, and wherein other parts of the first and second wires are electrically connected with the first and second leads, respectively, by wedge bonding.

19. The method according to claim 12,
wherein a thickness of the first surface-metal layer is larger than a thickness of the first pad, and
wherein a thickness of the second surface-metal layer is larger than a thickness of the second pad.

20. The method according to claim 1,
wherein a thickness of the first surface-metal layer is larger than a thickness of the first pad, and
wherein a thickness of the second surface-metal layer is larger than a thickness of the second pad.

* * * * *